(12) United States Patent
Yoshida et al.

(10) Patent No.: US 11,313,914 B2
(45) Date of Patent: Apr. 26, 2022

(54) ENERGY STORAGE SYSTEM, CAPACITY ESTIMATION DEVICE FOR SECONDARY BATTERY, AND CAPACITY ESTIMATION METHOD FOR LEAD-ACID BATTERY

(71) Applicant: GS Yuasa International Ltd., Kyoto (JP)

(72) Inventors: Toshihiro Yoshida, Kyoto (JP); Yuki Nakanishi, Kyoto (JP); Kazuhiro Sugie, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 34 days.

(21) Appl. No.: 16/756,910

(22) PCT Filed: Jul. 4, 2018

(86) PCT No.: PCT/JP2018/025286
§ 371 (c)(1),
(2) Date: Apr. 17, 2020

(87) PCT Pub. No.: WO2019/087462
PCT Pub. Date: May 9, 2019

(65) Prior Publication Data
US 2021/0096190 A1 Apr. 1, 2021

(30) Foreign Application Priority Data
Oct. 30, 2017 (JP) .............................. JP2017-209015

(51) Int. Cl.
*G01R 31/00* (2006.01)
*G01R 31/3842* (2019.01)
(Continued)

(52) U.S. Cl.
CPC ......... *G01R 31/3842* (2019.01); *G01K 3/005* (2013.01); *G01R 31/389* (2019.01);
(Continued)

(58) Field of Classification Search
USPC .................................................. 324/426–435
See application file for complete search history.

(56) References Cited

U.S. PATENT DOCUMENTS 5,539,318 A * 7/1996 Sasaki .............. G01R 19/16542
324/428
2002/0193954 A1 12/2002 Yamanaka
(Continued)

FOREIGN PATENT DOCUMENTS

JP 2002-107427 A 4/2002
JP 2005-274214 A 10/2005
(Continued)

OTHER PUBLICATIONS

International Search Report (ISR) dated Sep. 25, 2018 filed in PCT/JP2018/025286.

*Primary Examiner* — Vincent Q Nguyen
(74) *Attorney, Agent, or Firm* — Rankin, Hill & Clark LLP

(57) ABSTRACT

An energy storage system includes a lead-acid battery, a battery management unit. The battery management unit defines, based on an open voltage of the lead-acid battery, a first amount of change in a capacity of the lead-acid battery from a reference state, correlating with the open voltage of the lead-acid battery and caused by a first deterioration factor and defines, based on the first amount of change in the capacity and an amount of change in overall internal resistance of the lead-acid battery from the reference state, a second amount of change in a capacity of the lead-acid battery, not correlating with the open voltage and caused by a second deterioration factor. The battery management unit defines, based on the first and second amounts of change in the capacity, at least one of a battery capacity of the
(Continued)

lead-acid battery or an amount of change in the battery capacity from the reference state.

6 Claims, 12 Drawing Sheets

(51) Int. Cl.
    *G01R 31/389*    (2019.01)
    *G01R 31/392*    (2019.01)
    *G01K 3/00*    (2006.01)
    *H01M 10/48*    (2006.01)
    *H02J 7/00*    (2006.01)

(52) U.S. Cl.
    CPC ........ *G01R 31/392* (2019.01); *H01M 10/486* (2013.01); *H02J 7/0047* (2013.01)

(56) References Cited

U.S. PATENT DOCUMENTS

| | | | |
|---|---|---|---|
| 2006/0181245 A1* | 8/2006 | Mizuno | G01R 31/367 320/132 |
| 2011/0288691 A1* | 11/2011 | Abe | F03D 9/11 700/292 |
| 2016/0252582 A1 | 9/2016 | Iida et al. | |
| 2016/0370431 A1* | 12/2016 | Sejima | G01R 31/367 |

FOREIGN PATENT DOCUMENTS

| | | |
|---|---|---|
| JP | 2012-185122 A | 9/2012 |
| JP | 2014-7871 A | 1/2014 |
| JP | 2014-32825 A | 2/2014 |
| JP | 2015-108579 A | 6/2015 |

* cited by examiner

ENERGY STORAGE SYSTEM, CAPACITY ESTIMATION DEVICE FOR SECONDARY BATTERY, AND CAPACITY ESTIMATION METHOD FOR LEAD-ACID BATTERY

TECHNICAL FIELD

The technique disclosed in the present specification relates to an energy storage system.

BACKGROUND ART

Secondary batteries have been used broadly. The secondary battery is, for example, mounted on a moving body such as an automobile and is used as a power supply source for an electric motor, a power supply source for a starter at the time of engine start, and a power supply source for various electric components such as lights.

The secondary battery deteriorates, for example, when used for a long time, and its battery capacity (maximum dischargeable capacity or capacity in a fully charged state) decreases. Therefore, there is conventionally known a battery cell control device that detects a value of internal resistance of a secondary battery and determines the degree of deterioration in the secondary battery based on the detected value of the internal resistance (e.g., Patent Document 1).

PRIOR ART DOCUMENT

Patent Document

Patent Document 1: JP-A-2012-185122

SUMMARY OF THE INVENTION

Problems to be Solved by the Invention

For example, the moving body includes a display unit, and a display pattern according to the remaining battery level of the secondary battery is displayed on the display unit. In general, display patterns according to remaining battery levels are displayed differently from each other in accordance with the ratio of the present remaining battery level (remaining capacity) to the battery capacity. The user of the moving body sees the display pattern displayed on the display unit, grasps the remaining battery level of the secondary battery, and determines whether the secondary battery needs to be charged. However, when the secondary battery deteriorates and the battery capacity decreases, for example, even if the display pattern is the same, the actual remaining battery level is reduced and the time required for charge is shortened, making it impossible to accurately grasp the actual remaining battery level from the display pattern. This results in a cause of erroneous determination as to whether the secondary battery needs to be charged. As described above, even when the deterioration in the secondary battery has progressed, it is preferably to take measures such as a measure of accurately estimating the battery capacity and the like of the secondary battery and promoting, for example, the user to replace the secondary battery based on the estimation result.

However, in the above-described battery cell control device that determines the degree of deterioration in the secondary battery based only on the detected internal resistance value, a problem arises that the degree of deterioration or the battery capacity of the secondary battery cannot be estimated accurately, and appropriate measures cannot be taken on the secondary battery.

The present specification discloses a technique capable of improving the estimation accuracy for battery capacity of a secondary battery.

Means for Solving the Problems

An energy storage system disclosed in the present specification is an energy storage system including: a lead-acid battery; an electric motor operated by electric power from the lead-acid battery; a notification unit; and a battery management unit. The battery management unit defines, based on an open voltage of the lead-acid battery, a first amount of change in a capacity of the lead-acid battery from a reference state, correlating with the open voltage of the lead-acid battery and caused by a first deterioration factor. The battery management unit defines, based on the first amount of change in the capacity and an amount of change in overall internal resistance of the lead-acid battery from the reference state, a second amount of change in a capacity of the lead-acid battery, not correlating with the open voltage and caused by a second deterioration factor. The battery management unit defines, based on the first amount of change in the capacity and the second amount of change in the capacity, at least one of a battery capacity of the lead-acid battery or an amount of change in the battery capacity from the reference state. The notification unit performs a notification operation according to at least one of the battery capacity defined by the battery management unit or the amount of change in the battery capacity from the reference state.

MODES FOR CARRYING OUT THE INVENTION

Figure 1:
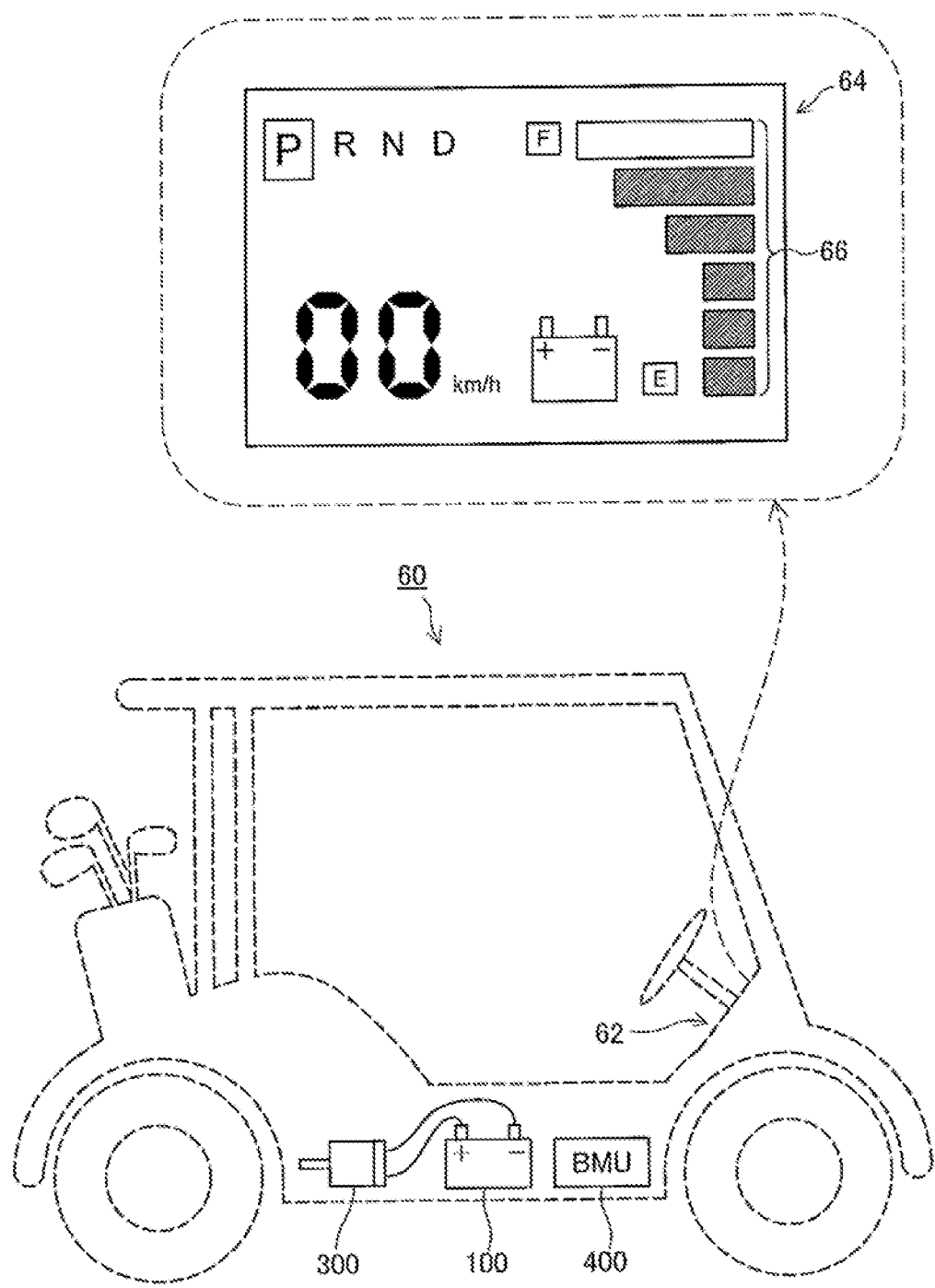
FIG. 1 is an explanatory view schematically illustrating a configuration of a golf cart 60 in the present embodiment.

The technique disclosed in the present specification can be achieved as the following forms.

(1) An energy storage system disclosed in the present specification is an energy storage system including: a lead-acid battery; an electric motor operated by electric power from the lead-acid battery; a notification unit; and a battery management unit. The battery management unit defines, based on an open voltage of the lead-acid battery, an amount of change in a first capacity of the lead-acid battery from a reference state, correlating with the open voltage of the lead-acid battery and caused by a first deterioration factor. The battery management unit defines, based on the amount of change in the first capacity and an amount of change in overall internal resistance of the lead-acid battery from the reference state, an amount of change in a second capacity not correlating with the open voltage and caused by a second deterioration factor of the lead-acid battery. The battery management unit defines, based on the amount of change in the first capacity and the amount of change in the second capacity, at least one of a battery capacity of the lead-acid battery or an amount of change in the battery capacity from the reference state. The notification unit performs a notification operation according to at least one of the battery capacity defined by the battery management unit or the amount of change in the battery capacity from the reference state.

As a result of intensive studies, the inventors of the present invention have newly found the following viewpoints (a) and (b).

(a) Deterioration factors (fluctuation factors of battery capacity) of a secondary battery (especially a lead-acid battery) are plural (e.g., sulfation and grid corrosion in the case of the lead-acid battery). Among the plurality of deterioration factors, there exist deterioration factors different in the change characteristic of the correlation between the capacity and the internal resistance of the secondary battery, associated with the progress of each deterioration factor, and the degrees of progress of the deterioration factors are different from each other depending on the usage environment of the secondary battery and the like.

(b) The deterioration factors with different correlations between the capacity and the internal resistance of the secondary battery include one in which the capacity (battery capacity) of the secondary battery that changes associated with the progress of each degradation factor correlates with the open voltage of the secondary battery (hereinafter referred to as "correlated factor") and one in which the capacity does not correlate with the open voltage (hereinafter referred to as "non-correlated factor").

Therefore, in view of the above viewpoint (a), in this energy storage system, the amount of change in a first capacity caused by the first deterioration factor (correlated factor) of the lead-acid battery and the amount of change in a second capacity caused by the second deterioration factor (non-correlated factor) are defined individually. First, the battery management unit defines, based on an open voltage of the lead-acid battery, the amount of change in a first capacity from a reference state (e.g., a state where the lead-acid battery is new), correlating with the open voltage and caused by a first deterioration factor. Next, the battery management unit defines, based on the amount of change in the first capacity and the amount of change in overall internal resistance of the lead-acid battery from the reference state, the amount of change in a second capacity not correlating with the open voltage and caused by a second deterioration factor. Then, the battery management unit defines, based on the amount of change in the first capacity and the amount of change in the second capacity, at least one of a battery capacity of the lead-acid battery or the amount of change in the battery capacity from the reference state. The notification unit performs a notification operation according to at least one of the battery capacity defined by the battery management unit or the amount of change in the battery capacity from the reference state. As a result, the battery capacity of the lead-acid battery can be accurately estimated, and appropriate measures can be taken according to the battery capacity.

(2) In the above energy storage system, the first deterioration factor may be sulfation at a negative electrode provided in the lead-acid battery, and the second deterioration factor may be corrosion of a grid provided in the lead-acid battery. According to this energy storage system, the amount of decrease in capacity caused by sulfation and the amount of decrease in capacity caused by corrosion of the grid are defined individually, so that the battery capacity of the lead-acid battery can be estimated accurately.

(3) A capacity estimation device for a secondary battery disclosed in the present specification is a capacity estimation device for a secondary battery, including:

an open voltage defining unit that defines a value of an open voltage of the secondary battery;

a first capacity defining unit that defines, based on the defined value of the open voltage and a first correlation between a first capacity correlating with the open voltage and caused by a first deterioration factor of the secondary battery and the open voltage, an amount of change in the first capacity of the secondary battery from a reference state;

a first internal resistance defining unit that defines, based on the defined amount of change in the first capacity and a second correlation between the first capacity and first internal resistance of the secondary battery, an amount of change in the first internal resistance caused by the first deterioration factor;

an overall resistance defining unit that defines an amount of change in overall internal resistance of the secondary battery;

a second internal resistance defining unit that defines an amount of change in second internal resistance by subtracting the defined amount of change in the first internal resistance from the defined amount of change in the overall internal resistance;

a second capacity defining unit that defines, based on the defined amount of change in the second internal resistance and a third correlation between a second capacity not correlating with the open voltage and caused by a second deterioration factor of the secondary battery and the second internal resistance, an amount of change in the second capacity of the secondary battery from the reference state; and a first battery capacity defining unit that defines a battery capacity of the secondary battery based on the defined amount of change in the first capacity and the defined amount of change in the second capacity.

In this capacity estimation device for a secondary battery, first, the amount of change in a first capacity of the secondary battery from a reference state, caused by the first deterioration factor (correlated factor), is defined. Specifically, based on a first correlation between the first capacity correlating with the open voltage and the open voltage, the amount of change in the first capacity corresponding to the defined open voltage value is defined. Next, the amount of change in a second capacity of the secondary battery from the reference state, caused by the second deterioration factor (non-correlated factor), is defined. Here, since the second capacity and second internal resistance associated with the progress of the second deterioration factor correlate with each other, when the amount of change in the second internal resistance can be defined, the amount of change in the second capacity can be defined. The amount of change in the overall internal resistance of the secondary battery from the reference state includes the amount of change in the first internal resistance associated with the progress of the first deterioration factor and the amount of change in the second internal resistance associated with the progress of the second deterioration factor. However, the amount of change in the first internal resistance and the amount of change in the second internal resistance cannot be distinguished only from the amount of change in the overall internal resistance.

Therefore, in this capacity estimation device for a secondary battery, in view of the above viewpoint (b), a second correlation between the first capacity caused by the first deterioration factor and the first internal resistance caused by the first deterioration factor is used. Specifically, the amount of change in the first internal resistance is defined based on the second correlation and the defined amount of change in the first capacity. Further, the amount of change in the overall internal resistance of the secondary battery is defined. Then, the amount of change in the second internal resistance is defined by subtracting the defined amount of change in the first internal resistance from the defined amount of change in the overall internal resistance. Next, the amount of change in the second capacity is defined based on the defined amount of change in the second internal resistance and a third correlation between the second capacity and the second internal resistance. As a result, the amount of change in the first capacity caused by the first deterioration factor and the amount of change in the second capacity caused by the second deterioration factor can be defined individually. Then, the battery capacity of the secondary battery can be accurately defined based on the defined amount of change in the first capacity and the defined amount of change in the second capacity.

(4) The capacity estimation device for a secondary battery may further include: a condition determination unit that determines whether a switching condition including at least one of a temperature of the secondary battery being equal to or higher than a predetermined temperature or an amount of overcharge of the secondary battery being equal to or higher than a reference amount is satisfied; and a second battery capacity defining unit that defines the battery capacity of the secondary battery by another estimation method not using the open voltage when it is determined that the switching condition is satisfied.

In this capacity estimation device for a secondary battery, when it is determined that a switching condition including at least one of a temperature of the secondary battery being equal to or higher than a predetermined temperature or an amount of overcharge of the secondary battery being equal to or higher than a reference amount is satisfied, the battery capacity of the secondary battery is defined by another estimation method not using the open voltage. For example, the first correlation regarding the open voltage may fluctuate due to a rise in the temperature of the secondary battery, and the accuracy in the estimation of the battery capacity of the secondary battery by the first battery capacity defining unit may decrease. Even in such a case, according to the capacity estimation device for a secondary battery, another estimation method not using the open voltage is performed, so that it is possible to prevent a decrease in the estimation accuracy for the battery capacity of the secondary battery caused by the fluctuation of the correlation regarding the open voltage.

(5) The above capacity estimation device for a secondary battery may further include: an acquisition unit that acquires current and voltage of the secondary battery; and a voltage defining unit that defines, based on the current and the voltage acquired by the acquisition unit, a value of the voltage of the secondary battery a plurality of times when a value of the current of the secondary battery is a reference value. The second battery capacity defining unit may define, based on a fourth correlation between a change tendency of the voltage the secondary battery and the battery capacity of the secondary battery, a value of the battery capacity of the secondary battery corresponding to a change tendency in the value of the voltage defined the plurality of times.

In the capacity estimation device for a secondary battery, when it is determined that the switching condition is satisfied, based on the acquired current and voltage, a voltage value of the secondary battery when the current value of the secondary battery is a reference value is defined a plurality of times. Next, based on a fourth correlation between the voltage change tendency (slope) of the secondary battery and the battery capacity of the secondary battery, the value of the battery capacity of the secondary battery corresponding to the change tendency in the defined voltage value for a plurality of times is defined. As a result, even when the correlation regarding the open voltage fluctuates, the value of the battery capacity of the secondary battery can be estimated accurately as compared to the conventional estimation method that estimates the battery capacity of the secondary battery based on the value of the overall internal resistance of the secondary battery.

(6) A method for estimating the capacity of a lead-acid battery disclosed in the present specification is a capacity estimation method for a lead-acid battery, including the steps of:

defining, based on an open voltage of the lead-acid battery, an amount of change in a first capacity of the lead-acid battery from a reference state, correlating with the open voltage and caused by a first deterioration factor;

defining, based on the amount of change in the first capacity and an amount of change in overall internal resistance of the lead-acid battery from the reference state, an amount of change in a second capacity not correlating with the open voltage and caused by a second deterioration factor of the lead-acid battery, and defining a battery capacity of the lead-acid battery based on the amount of change in the first capacity and the amount of change in the second capacity.

The technique disclosed in the present specification can be achieved in various forms and can be achieved in the forms of, for example, a capacity estimation device, a capacity estimation method, a computer program for achieving the functions of the device or the method, a non-transitory recording medium on which a computer program is recorded, and the like. Further, the technique disclosed in the present specification may be applied to a management device (e.g., a central management device in a factory, an external server, etc.) managed by a moving body from a remote place.

A. Embodiment

A-1. Configuration:

FIG. 1 is an explanatory diagram schematically illustrating a configuration of a golf cart 60 according to the present embodiment. As illustrated in FIG. 1, the golf cart 60 includes a lead-acid battery 100 as a battery, a drive motor 300 as an electric motor, a battery management unit (BMU) 400 for managing the state of the lead-acid battery 100, and an operation unit 62. The golf cart 60 is a moving body that travels with the power of the drive motor 300 which operates with electric power from the lead-acid battery 100, and the golf cart 60 is capable of traveling on a predetermined road in a golf course by automatic driving.

The operation unit 62 is disposed, for example, near the steering wheel of the golf cart 60. As illustrated in FIG. 1 in an enlarged manner, the operation unit 62 is provided with a display unit 64 configured by, for example, a liquid crystal display or the like and displaying various images and information. On the display unit 64, a display pattern 66 according to the remaining battery level of the lead-acid battery 100 is displayed. Specifically, "F" on the screen of the display unit 64 means that the lead-acid battery 100 is in a fully charged state (e.g., a state where the voltage of the lead-acid battery 100 is equal to or higher than a predetermined voltage upper limit), and "E" on the screen of the display unit 64 means that the lead-acid battery 100 is in a poor charged state (e.g., a state where the voltage of the lead-acid battery 100 is equal to or lower than a predetermined voltage lower limit). A plurality of bars having different lengths on the screen of the display unit 64 are displayed in patterns different from each other in accordance with the ratio (hereinafter referred to as "charging rate") of the present capacity (the remaining capacity) to the battery capacity of the lead-acid battery 100 (the maximum dischargeable capacity of the lead-acid battery 100 or the capacity in the fully charged state). Specifically, as the charging rate of the lead-acid battery 100 decreases and approaches the poor charged state, only the bar near the "E" lights up, and as the charging rate of the lead-acid battery 100 increases and approaches the fully charged state, the bars from the bar near "E" to the bar near "F" light up.

As a result, the user of the golf cart 60 can intuitively grasp the remaining battery level of the lead-acid battery 100 by looking at the display pattern 66 displayed on the display unit 64. The lead-acid battery 100 provided in the golf cart 60 can be charged with a charger (not illustrated). Thus, when the user of the golf cart 60 looks at the display pattern 66 displayed on the display unit 64 and determines that the lead-acid battery 100 is approaching the poor charged state, the lead-acid battery 100 can be charged by the charger. For a moving body such as the golf cart 60 that requires frequent charge, high accuracy is required particularly for estimating the battery capacity. Further, the lead-acid battery 100 is heavier than other secondary batteries and is thus often mounted on a moving body such as the golf cart 60 for stable traveling. The golf cart 60 corresponds to an energy storage system in the claims, the lead-acid battery 100 corresponds to a secondary battery in the claims, the BMU 400 corresponds to a battery management unit and a capacity estimation device in the claims, and the display unit 64 corresponds to a notification unit in the claims.

Figure 2:
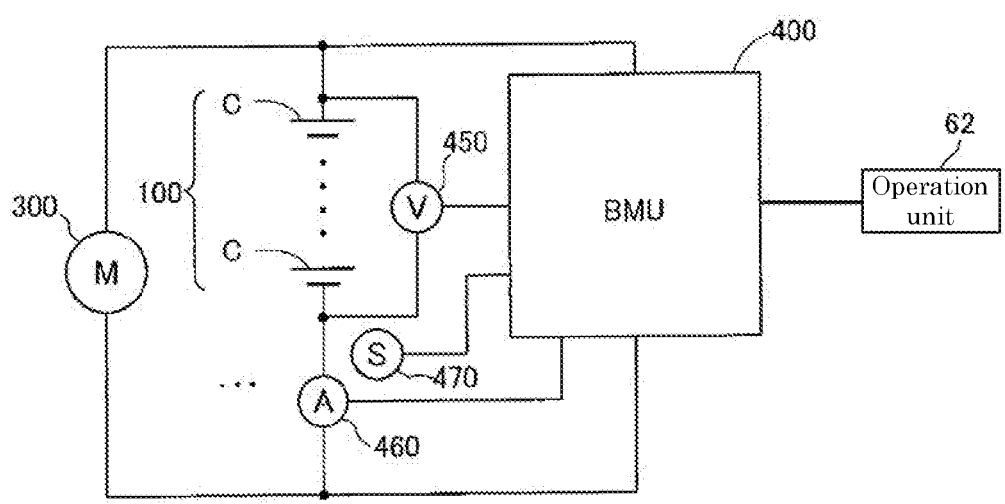
FIG. 2 is an explanatory diagram schematically illustrating an electric configuration of the golf cart 60.

FIG. 2 is an explanatory diagram schematically illustrating an electrical configuration of the golf cart 60. As illustrated in FIG. 2, the golf cart 60 includes a voltage detection unit 450, a current detection unit 460, and a temperature detection unit 470 in addition to the above-described lead-acid battery 100, drive motor 300, and BMU 400. The lead-acid battery 100 is an assembled battery in which a plurality of cells C are connected in series.

(Configuration of Each Detection Unit)

The voltage detection unit 450 is connected in parallel with the lead-acid battery 100 and outputs a detection result according to the overall voltage value of the lead-acid battery 100. The current detection unit 460 is connected in series with the lead-acid battery 100 and outputs a detection result according to the value of the current (charge-discharge current) flowing through the lead-acid battery 100. The temperature detection unit 470 is disposed near the lead-acid battery 100 and outputs a detection result according to the temperature of the lead-acid battery 100.

(Configuration of BMU 400)

Figure 3:
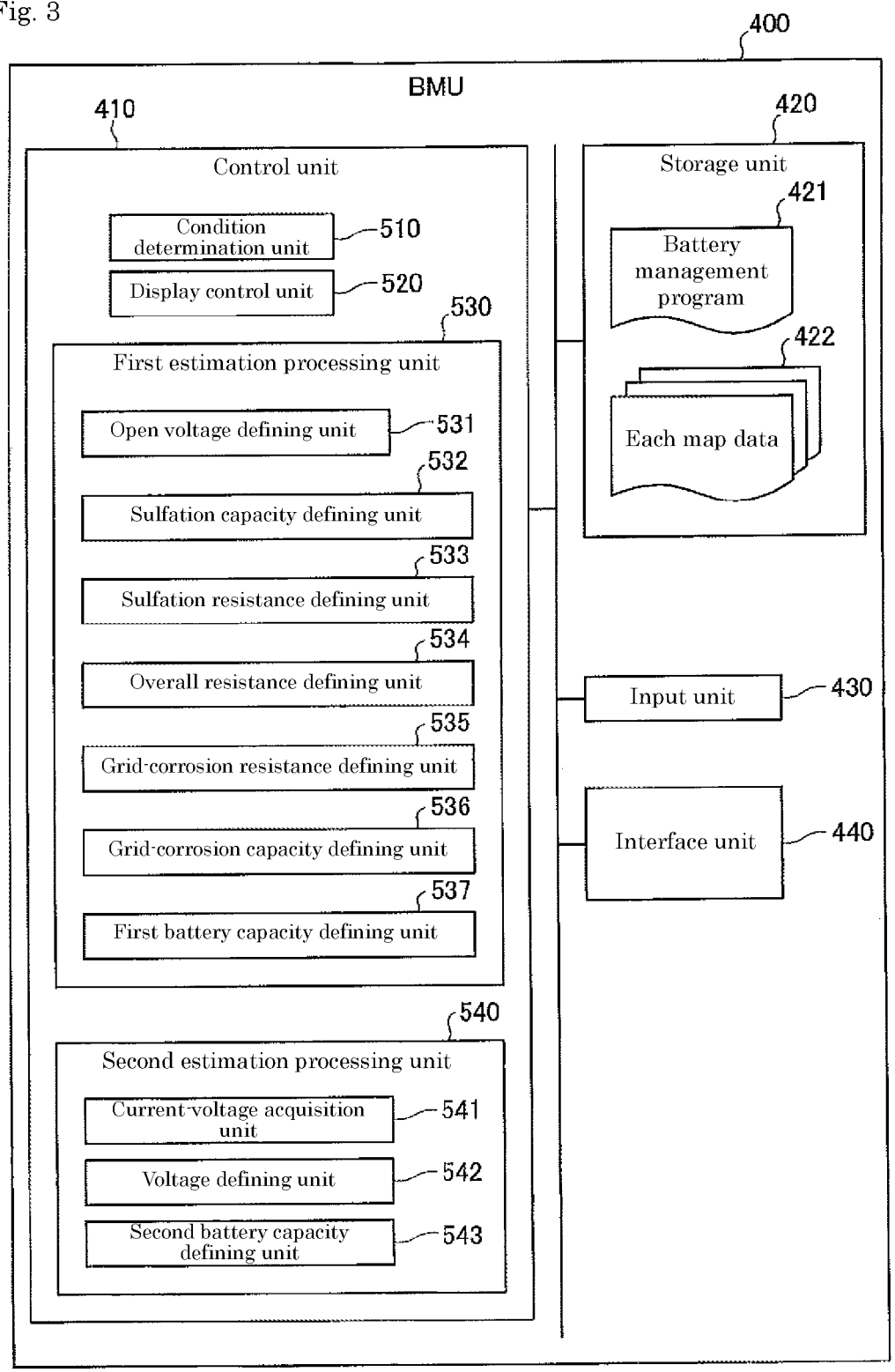
FIG. 3 is an explanatory diagram schematically illustrating a configuration of a battery management unit (BMU) 400.

FIG. 3 is an explanatory diagram schematically illustrating the configuration of the BMU 400. The BMU 400 includes a control unit 410, a storage unit 420, an input unit 430, and an interface unit 440. Each of these units is communicably connected to each other via a bus.

The input unit 430 receives input of a detection result from each of the voltage detection unit 450, the current detection unit 460, and the temperature detection unit 470. The interface unit 440 is configured by, for example, a local area network (LAN) interface, a universal serial bus (USB) interface, or the like, and communicates with another device (e.g., operation unit 62) by wire or wirelessly.

The storage unit 420 is configured by, for example, a hard disk drive (HDD) and stores various programs and data. For example, the storage unit 420 stores a battery management program 421 for performing battery management processing to be described later. The battery management program 421 is provided, for example, in the state of being stored in a computer-readable recording medium (not illustrated), such as a compact disc read-only memory (CD-ROM), a digital versatile disc read-only memory (DVDROM), and a USB memory, and is stored into the storage unit 420 by being installed into the BMU 400. Further, the storage unit 420 stores each map data 422 to be described later. Each map data 422 is input into the BMU 400 via the interface unit 440 and stored into the storage unit 420.

The control unit 410 performs a computer program, made up of, for example, a central processing unit (CPU), a ROM, a random-access memory (RAM), and the like and read from the storage unit 420, to control the operation of the BMU 400. For example, the control unit 410 reads and performs the battery management program 421 to function as a processing unit that performs battery management processing to be described later. Specifically, the control unit 410 includes a condition determination unit 510, a display control unit 520, a first estimation processing unit 530, and a second estimation processing unit 540. The first estimation processing unit 530 includes an open voltage defining unit 531, a sulfation capacity defining unit 532, a sulfation resistance defining unit 533, an overall resistance defining unit 534, a grid-corrosion resistance defining unit 535, a grid-corrosion capacity defining unit 536, and a first battery capacity defining unit 537. The second estimation processing unit 540 includes a current-voltage acquisition unit 541, a voltage defining unit 542, and a second battery capacity defining unit 543. The functions of these units will be described later in the description of the battery management processing to be given later.

(Configuration of Lead-Acid Battery 100)

Figure 4:
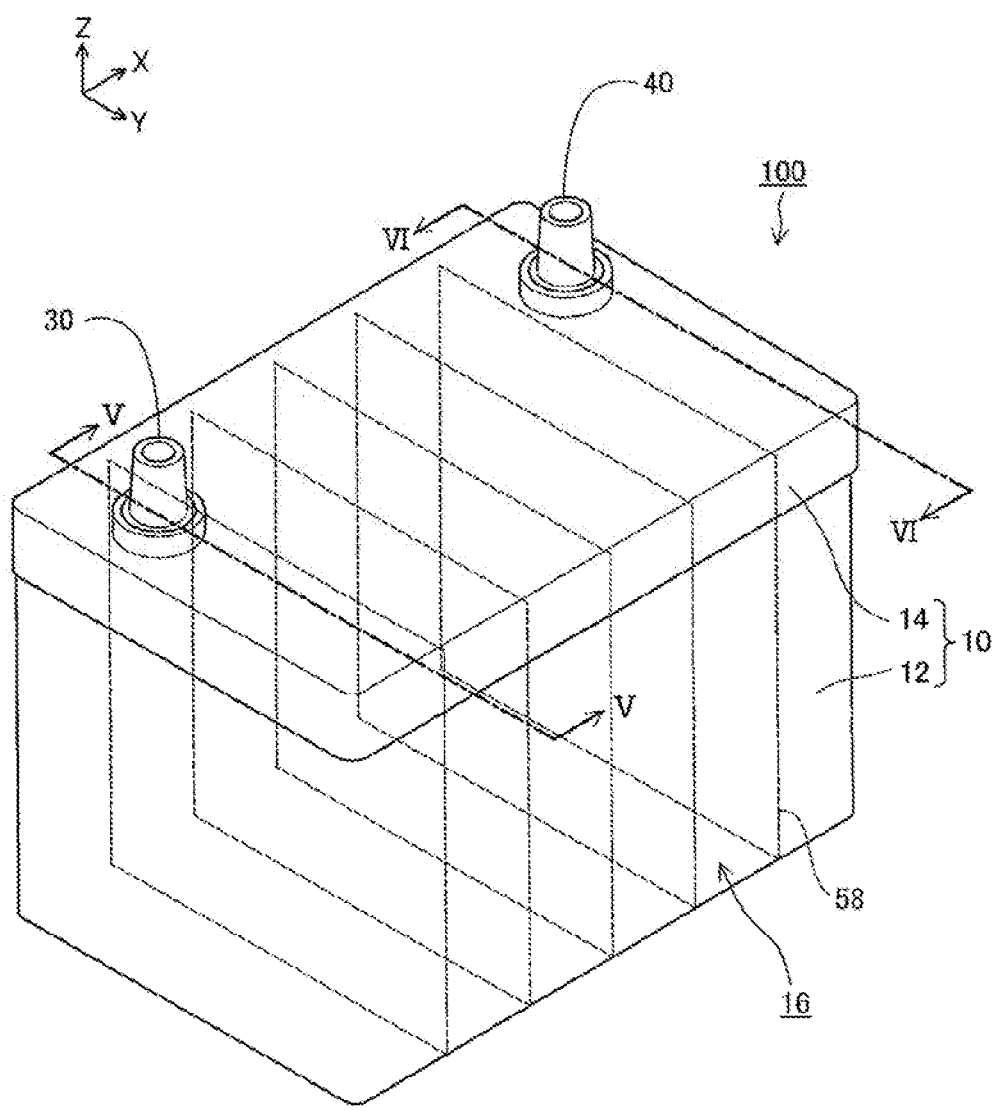
FIG. 4 is a perspective view illustrating an external configuration of a lead-acid battery 100.
Figure 5:
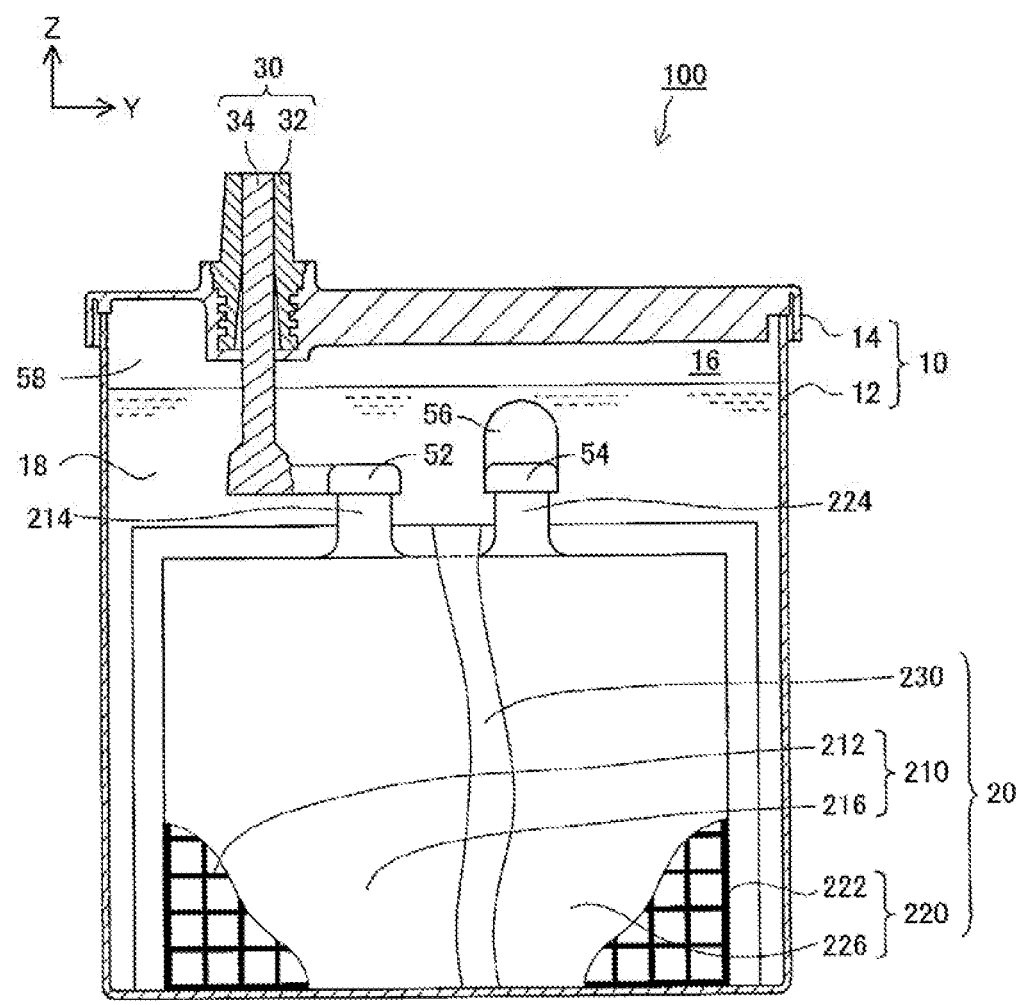
FIG. 5 is an explanatory view illustrating a YZ cross-sectional configuration of the lead-acid battery 100 at a position of V-V in FIG. 4.
Figure 6:
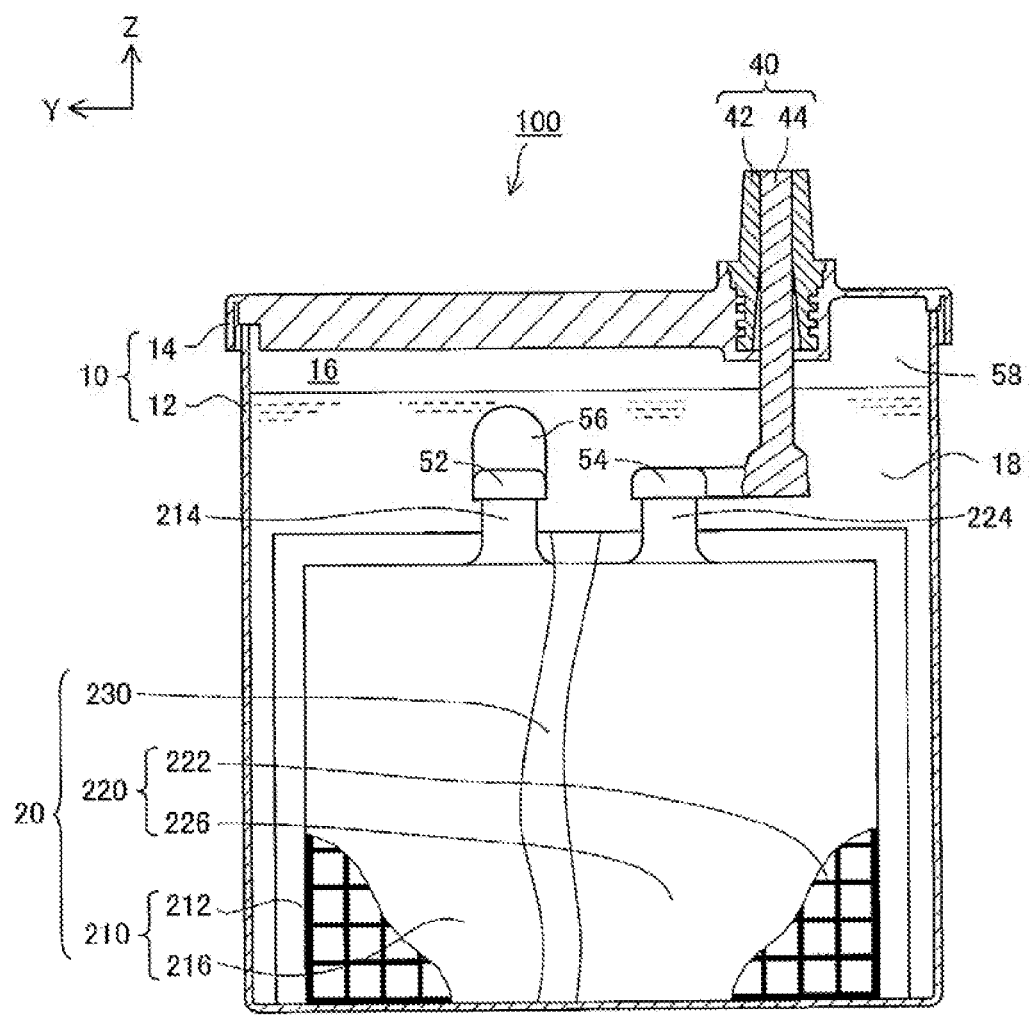
FIG. 6 is an explanatory view illustrating a YZ cross-sectional configuration of the lead-acid battery 100 at a position VI-VI in FIG. 4.

FIG. 4 is a perspective view illustrating the external configuration of the lead-acid battery 100, FIG. 5 is an explanatory view illustrating a YZ cross-sectional configuration of the lead-acid battery 100 at a position of V-V in FIG. 4, and FIG. 6 is an explanatory view illustrating a YZ cross-sectional configuration of the lead-acid battery 100 at a position VI-VI in FIG. 4. In FIGS. 5 and 6, for convenience, a configuration of an element 20 to be described later is represented in a form different from the actual configuration so that the configuration of the element 20 can be illustrated simply. Each figure illustrates XYZ axes orthogonal to each other for defining the directions. In the present specification, for convenience, the positive Z-axis direction will be referred to as an "upward direction," and the negative Z-axis direction will be referred to as a "downward direction." However, the lead-acid battery 100 may actually be installed in an orientation different from those described above.

As illustrated in FIGS. 4 to 6, the lead-acid battery 100 includes a housing 10, a positive-side terminal 30, a negative-side terminal 40, and a plurality of elements 20. Hereinafter, the positive-side terminal 30 and the negative-side terminal 40 will also be referred to collectively as "terminals 30, 40."

(Configuration of Housing 10)

The housing 10 includes a container 12 and a lid 14. The container 12 is a substantially rectangular parallelepiped case having an opening on the upper surface and is formed of a synthetic resin, for example. The lid 14 is a member disposed so as to close the opening of the container 12, and is formed of a synthetic resin, for example. By joining the peripheral portion of the lower surface of the lid 14 and the peripheral portion of the opening of the container 12 by, for example, heat welding, a space which is kept airtight from the outside is formed in the housing 10. The space in the housing 10 is partitioned by partitions 58 into a plurality of (e.g., six) cell chambers 16 arranged in a predetermined direction (the X-axis direction in the present embodiment). Hereinafter, the direction in which the plurality of cell chambers 16 are arranged (X-axis direction) will be referred to as a "cell arrangement direction."

One element 20 is housed in each cell chamber 16 in the housing 10. Thus, for example, when the space in the housing 10 is partitioned into six cell chambers 16, the lead-acid battery 100 includes six elements 20. Each cell chamber 16 in the housing 10 contains an electrolyte solution 18 containing dilute sulfuric acid, and the entire element 20 is immersed in the electrolyte solution 18. The electrolyte solution 18 is injected into the cell chamber 16 from an electrolyte solution filling port (not illustrated) provided in the lid 14.

(Configuration of Element 20)

The element 20 includes a plurality of positive electrode plates 210, a plurality of negative electrode plates 220, and a separator 230. The plurality of positive electrode plates 210 and the plurality of negative electrode plates 220 are arranged such that the positive electrode plates 210 and the negative electrode plates 220 are arranged alternately. Hereinafter, the positive electrode plate 210 and the negative electrode plate 220 will also be referred to collectively as "electrode plates 210, 220."

The positive electrode plate 210 includes a positive current collector 212 and a positive active material 216 supported by the positive current collector 212. The positive current collector 212 is a conductive member having bones arranged in substantially a grid form or a net-like form and is formed of lead or a lead alloy, for example. Further, the positive current collector 212 includes a positive electrode lug 214 protruding upward near the upper end of the positive current collector 212. The positive active material 216 contains lead dioxide. The positive active material 216 may further contain a known additive.

The negative electrode plate 220 includes a negative current collector 222 and a negative active material 226 supported by the negative current collector 222. The negative current collector 222 is a conductive member having bones arranged in substantially a grid form or a net-like form and is formed of lead or a lead alloy, for example. Further, the negative current collector 222 includes a negative electrode lug 224 protruding upward near the upper end of the negative current collector 222. The negative active material 226 contains lead. The negative active material 226 may further contain a known additive.

The separator 230 is formed of an insulating material (e.g., glass or synthetic resin). The separator 230 is disposed so as to be interposed between the adjacent positive electrode plate 210 and negative electrode plate 220. The separator 230 may be configured as an integral member or may be configured as a set of a plurality of members provided for each combination of the positive electrode plate 210 and the negative electrode plate 220.

The positive electrode lugs 214 of the plurality of positive electrode plates 210 constituting the element 20 are connected to a positive-side strap 52 formed of lead or a lead alloy, for example. That is, the plurality of positive electrode plates 210 are electrically connected in parallel via the positive-side strap 52. Similarly, the negative electrode lugs 224 of the plurality of negative electrode plates 220 constituting the element 20 are connected to a negative-side strap 54 formed of lead or a lead alloy, for example. That is, the plurality of negative electrode plates 220 are electrically connected in parallel via the negative-side strap 54. Hereinafter, the positive-side strap 52 and the negative-side strap 54 will also be referred to collectively as "straps 52, 54."

In the lead-acid battery 100, the negative-side strap 54 housed in one cell chamber 16 is connected to the positive-side strap 52 housed in another cell chamber 16 adjacent to one side (e.g., the positive side in the X-axis direction) of the one cell chamber 16 via a connecting member 56 formed of lead or a lead alloy, for example. Further, the positive-side strap 52 housed in the one cell chamber 16 is connected to the negative-side strap 54 housed in another cell chamber 16 adjacent to the other side (e.g., the negative side in the X-axis direction) of the one cell chamber 16 via the connecting member 56. That is, the plurality of elements 20 provided in the lead-acid battery 100 are electrically connected in series via the straps 52, 54 and the connecting member 56. As illustrated in FIG. 5, the positive-side strap 52 housed in the cell chamber 16 located at one-side (the negative side in the X-axis direction) end in the cell arrangement direction is connected not to a connecting member 56, but to a positive pole 34 to be described later. Further, as illustrated in FIG. 6, the negative-side strap 54 housed in the cell chamber 16 located at the other-side (the positive side in the X-axis direction) end in the cell arrangement direction is connected not to a connecting member 56, but to a negative pole 44 to be described later.

(Configuration of Terminals 30, 40)

The positive-side terminal 30 is disposed near the one-side (the negative side in the X-axis direction) end in the cell arrangement direction in the housing 10, and the negative-side terminal 40 is disposed near the other-side (the positive side in the X-axis direction) end in the cell arrangement direction in the housing 10.

As illustrated in FIG. 5, the positive-side terminal 30 includes a positive-side bushing 32 and the positive pole 34. The positive-side bushing 32 is a substantially cylindrical conductive member in which a vertically penetrating hole is formed, and the positive-side bushing 32 is formed of a lead alloy, for example. The lower portion of the positive-side bushing 32 is embedded in the lid 14 by insert molding, and the upper portion of the positive-side bushing 32 protrudes upward from the upper surface of the lid 14. The positive pole 34 is a substantially cylindrical conductive member and is formed of a lead alloy, for example. The positive pole 34 has been inserted into the hole of the positive-side bushing 32. The upper end of the positive pole 34 is located at substantially the same position as the upper end of the positive-side bushing 32, and is joined to the positive-side bushing 32 by, for example, welding. The lower end of the positive pole 34 protrudes below the lower end of the positive-side bushing 32, and further protrudes below the lower surface of the lid 14. As described above, the lower end of the positive pole 34 is connected to the positive-side strap 52 housed in the cell chamber 16 located at one-side (the negative side in the X-axis direction) end in the cell arrangement direction.

As illustrated in FIG. 6, the negative-side terminal 40 includes a negative-side bushing 42 and a negative pole 44. The negative-side bushing 42 is a substantially cylindrical conductive member in which a vertically penetrating hole is formed, and the negative-side bushing 42 is formed of a lead alloy, for example. The lower portion of the negative-side bushing 42 is embedded in the lid 14 by insert molding, and the upper portion of the negative-side bushing 42 protrudes upward from the upper surface of the lid 14. The negative pole 44 is a substantially cylindrical conductive member and is formed of a lead alloy, for example. The negative pole 44 has been inserted into the hole of the negative-side bushing 42. The upper end of the negative pole 44 is located at substantially the same position as the upper end of the negative-side bushing 42, and is joined to the negative-side bushing 42 by, for example, welding. The lower end of the negative pole 44 protrudes below the lower end of the negative-side bushing 42, and further protrudes below the lower surface of the lid 14. As described above, the lower end of the negative pole 44 is connected to the negative-side strap 54 housed in the cell chamber 16 located at the other-side (the positive side in the X-axis direction) end in the cell arrangement direction.

During the discharge of the lead-acid battery 100, a load (not illustrated) is connected to the positive-side bushing 32 of the positive-side terminal 30 and the negative-side bushing 42 of the negative-side terminal 40. Electric power generated by a reaction at the positive electrode plate 210 of each element 20 (a reaction that generates lead sulfate from lead dioxide) and a reaction at the negative electrode plate 220 of each element 20 (a reaction that generates lead sulfate from lead (spongy lead)) is supplied to the load. During the charge of the lead-acid battery 100, a power supply (not illustrated) is connected to the positive-side bushing 32 of the positive-side terminal 30 and the negative-side bushing 42 of the negative-side terminal 40. By electric power supplied from the power supply, a reaction at the positive electrode plate 210 of each element 20 (a reaction that generates lead dioxide from lead sulfate) and a reaction at the negative electrode plate 220 of each element 20(a reaction that generates lead (spongy lead) from lead sulfate), and the lead-acid battery 100 is charged.

A-2. Battery Management Processing:

Next, battery management processing performed by the BMU 400 will be described. The battery management processing is the processing of estimating the battery capacity of the lead-acid battery 100 and causing the display unit 64 to display contents according to the estimated battery capacity.

Figure 7:
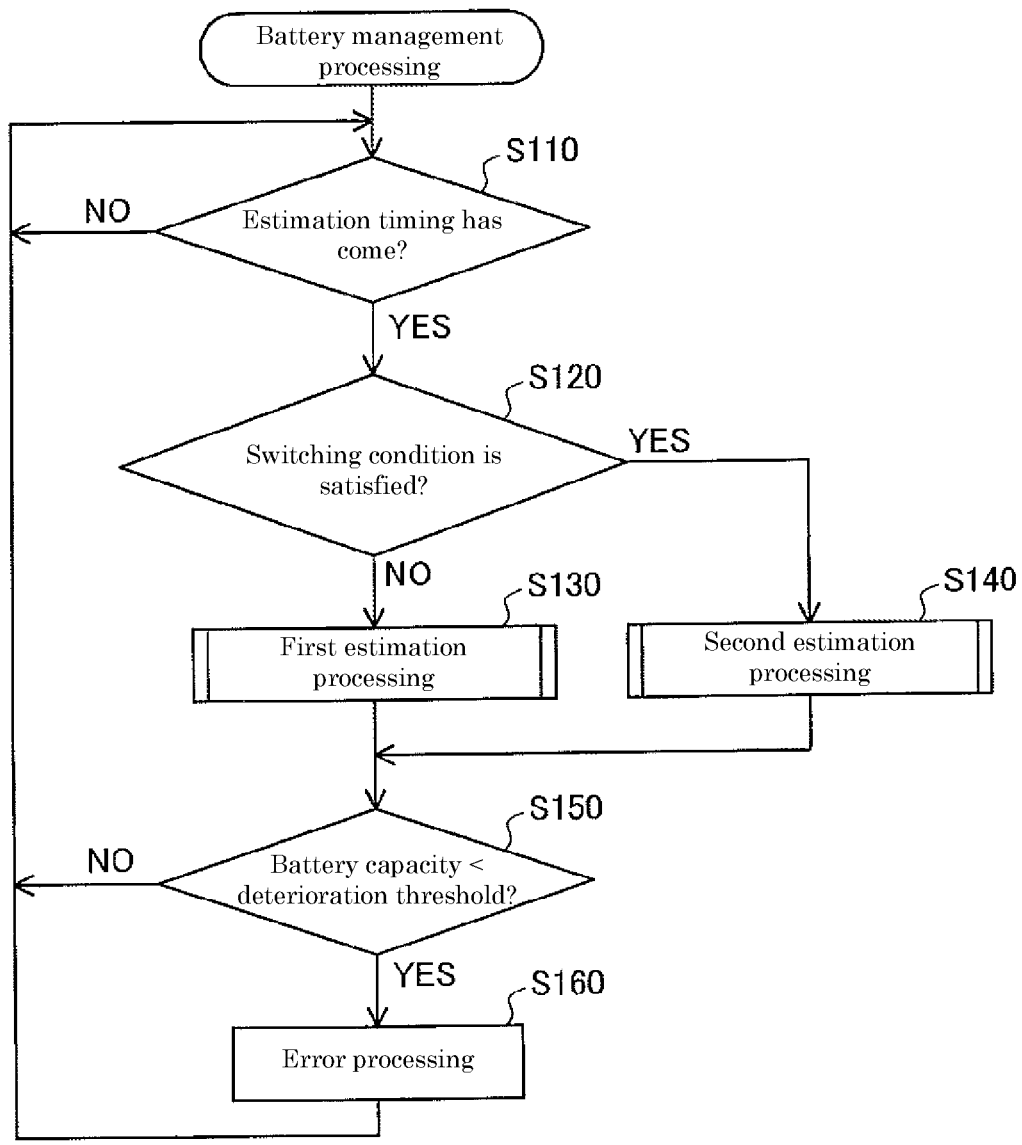
FIG. 7 is a flowchart illustrating a flow of battery management processing.

FIG. 7 is a flowchart illustrating the flow of the battery management processing. First, the condition determination unit 510 determines whether an estimation timing for estimating the battery capacity of the lead-acid battery 100 has come (S110). The condition determination unit 510 determines that the estimation timing has come, for example, on the condition that a predetermined time has passed since the stoppage of the drive motor 300 in the golf cart 60 or the completion of the charge of the lead-acid battery 100 by the charger. The condition determination unit 510 can recognize that the drive motor 300 has stopped when determining that the current flowing through the lead-acid battery 100 has become equal to or less than the current lower limit value based on the detection result from the current detection unit 460. Further, based on the detection result from the voltage detection unit 450, the condition determination unit 510 can recognize that the charge of the lead-acid battery 100 has been completed when determining that the voltage value of the lead-acid battery 100 has become equal to or higher than the voltage upper limit value or when receiving a charge completion notification from the charger described above.

When it is determined that the estimation timing has not come (S110: NO), the condition determination unit 510 repeats the determination of S110. On the other hand, when it is determined that the estimation timing has come (S110: YES), the condition determination unit 510 determines whether the switching condition is satisfied (S120). Here, the switching condition is a condition for performing the second estimation processing instead of first estimation processing to be described later, and specifically, the switching condition includes at least one of the temperature of the lead-acid battery 100 being equal to or higher than a predetermined temperature or the amount of overcharge of the lead-acid battery 100 being equal to or more than a reference amount. Note that the condition determination unit 510 can recognize that the temperature of the lead-acid battery 100 has become equal to or higher than a predetermined temperature based on the detection result from the temperature detection unit 470. Further, the condition determination unit 510 can recognize that the amount of overcharge of the lead-acid battery 100 has become equal to or more than the reference amount based on the detection results of the voltage detection unit 450 and the current detection unit 460.

When it is determined that the switching condition is not satisfied (S120: NO), the first estimation processing unit 530 performs first estimation processing (S130), and when it is determined that the switching condition is satisfied (S120: YES), the second estimation processing unit 540 performs second estimation processing (S140). The contents of the first estimation processing and the second estimation processing will be described later. When the first estimation processing or the second estimation processing is performed, the display control unit 520 determines whether the battery capacity of the lead-acid battery 100 estimated in the first estimation processing or the second estimation processing is less than a deterioration threshold (S150). When it is determined that the battery capacity of the lead-acid battery 100 is less than the deterioration threshold (S150: YES), error processing is performed (S160). Specifically, the display control unit 520 causes the display unit 64 to display a sign for prompting replacement of the lead-acid battery 100. For example, a battery mark shown on the screen of the display unit 64 in FIG. 1 is caused to flash. When the error processing (S160) is performed, the processing returns to S110. On the other hand, when it is determined that the battery capacity of the lead-acid battery 100 is not less than the deterioration threshold (S150: NO), the error processing (S150) is skipped, and the processing returns to S110.

A-3. First Estimation Processing:

Next, the first estimation processing will be described. The first estimation processing is the processing of individually defining, for each of deterioration factors of the lead-acid battery 100, the amount of decrease in the battery capacity of the lead-acid battery 100 associated with the progress of the deterioration factor, and estimating the battery capacity of the lead-acid battery 100 based on the defined amount of decrease in capacity for each of the defined deterioration factors. The deterioration factors in the present embodiment is sulfation (crystallization of lead sulfate) generated on the negative electrode plate 220 in the lead-acid battery 100, and corrosion (e.g., oxidation corrosion) of the positive current collector 212 and the negative current collector 222 in the lead-acid battery 100 (hereinafter referred to as "grid corrosion").

(Relationship Among Each Deterioration Factor, Open Voltage, Internal Resistance, and Battery Capacity)

Figure 8:
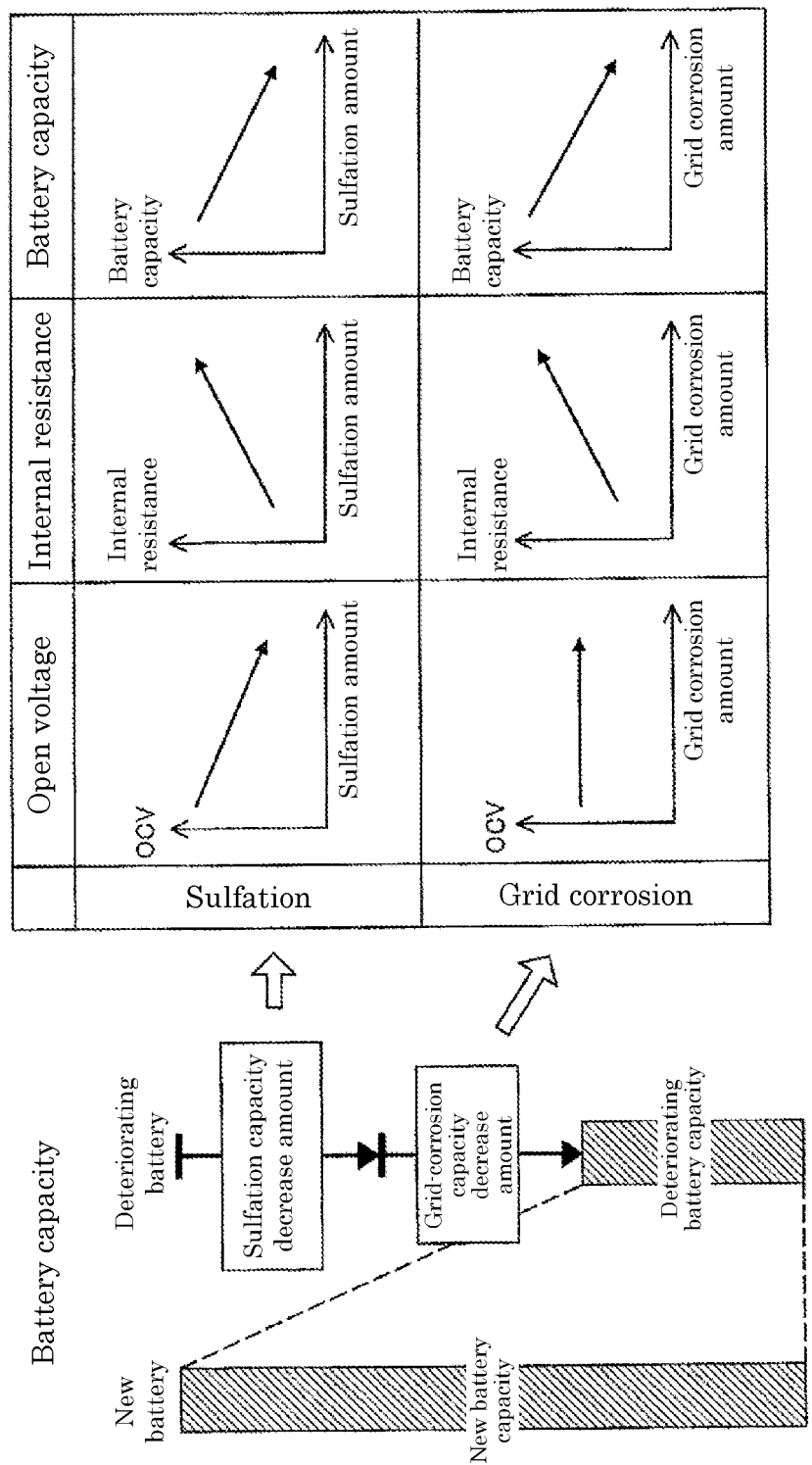
FIG. 8 is an explanatory diagram illustrating a relationship among each deterioration factor, an open voltage, internal resistance, and a battery capacity of the lead-acid battery 100.

FIG. 8 is an explanatory diagram illustrating a relationship among each deterioration factor (sulfation, grid corrosion), the open voltage, the internal resistance, and the battery capacity of the lead-acid battery 100. As illustrated on the left side of FIG. 8, the amount of decrease in battery capacity caused by the deterioration in the lead-acid battery 100 (the difference between the capacity of a new battery and the capacity of a deteriorating battery in FIG. 8) includes the amount of decrease in the capacity of the lead-acid battery 100 from the time when the battery is new, associated with the progress of sulfation (hereinafter referred to as "sulfation capacity decrease amount $\Delta CA$"), and the amount of decrease in the capacity of the lead-acid battery 100 from the time when the battery is new, associated with the progress of grid corrosion (hereinafter referred to as "grid-corrosion capacity decrease amount $\Delta CB$"). As can be seen from the graph regarding the internal resistance and the battery capacity illustrated on the right side of FIG. 8, as the sulfation progresses, the internal resistance of the lead-acid battery 100 increases due to accumulation of the insulative lead sulfate in the active material, and the battery capacity of the lead-acid battery 100 decreases due to an increase in active material unrelated to the reaction. Similarly, when the grid corrosion progresses, the internal resistance of the lead-acid battery 100 increases due to an increase in electrical resistance between the positive current collector 212 (grid) and the positive active material 216 or the like, and the battery capacity of the lead-acid battery 100 decreases due to an increase in active material unrelated to the reaction. However, the change characteristic of the correlation between the internal resistance and the battery voltage of the lead-acid battery 100 associated with the progress of sulfation is different from the change characteristic of the correlation between the internal resistance and the battery voltage of the lead-acid battery 100 associated with the progress of grid corrosion. Moreover, the degree of progress in sulfation and the degree of progress in grid corrosion are different from each other depending on the use environment of the lead-acid battery 100 and the like. Therefore, for accurately estimating the battery capacity of the lead-acid battery 100, it is preferable to individually define the sulfation capacity decrease amount $\Delta CA$ and the grid-corrosion capacity decrease amount $\Delta CB$.

Also, as can be seen from the graph regarding the open voltage illustrated on the right side of FIG. 8, when the sulfation progresses, the open voltage of the lead-acid battery 100 decreases, but even when the grid corrosion progresses, the open voltage of the lead-acid battery 100 does not change. This means that the sulfation capacity decrease amount $\Delta CA$ correlates with the open voltage, but the grid-corrosion capacity decrease amount $\Delta CB$ does not correlate with the open voltage. The reason for that is considered as follows. When the sulfation occurs, lead sulfate is not reduced even when the lead-acid battery 100 is charged, so that the concentration of the electrolyte solution 18 decreases, and accordingly, the open voltage decreases. On the other hand, the occurrence of grid corrosion does not affect the concentration of the electrolyte solution 18, so that the open voltage does not change.

As described below, in the first estimation processing, the sulfation capacity decrease amount $\Delta CA$ and the grid-corrosion capacity decrease amount $\Delta CB$ are individually defined using that the sulfation capacity decrease amount $\Delta CA$ correlates with the open voltage, but the grid-corrosion capacity decrease amount $\Delta CB$ does not correlate with the open voltage. Note that the sulfation corresponds to a first deterioration factor in the claims, and the sulfation capacity decrease amount $\Delta CA$ corresponds to a first amount of change in a capacity in the claims. The grid corrosion corresponds to a second deterioration factor in the claims, and the grid-corrosion capacity decrease amount $\Delta CB$ corresponds to a second amount of change in a capacity in the claims.

(Contents of First Estimation Processing)

Figure 9:
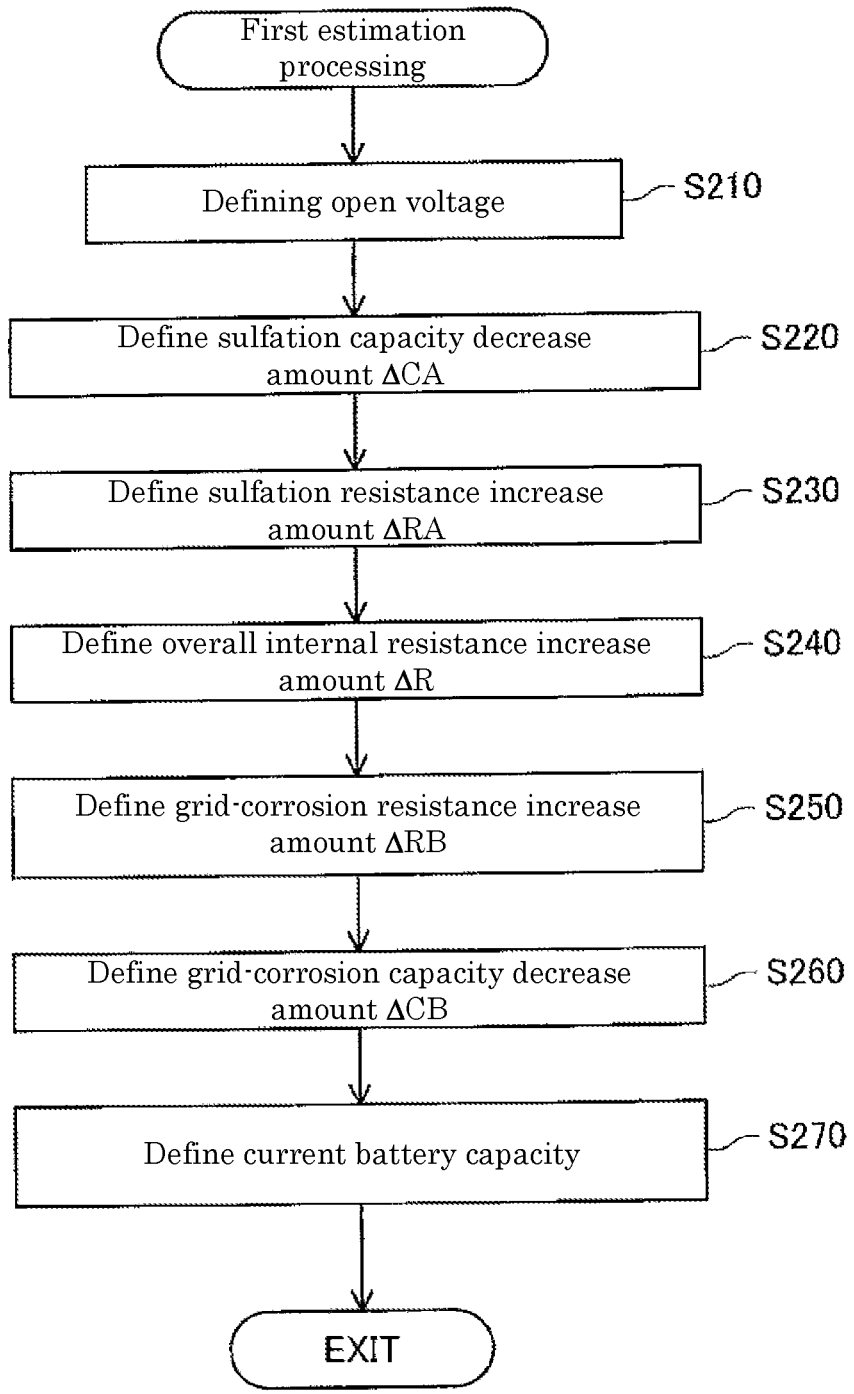
FIG. 9 is a flowchart illustrating a flow of first estimation processing.
Figure 10:
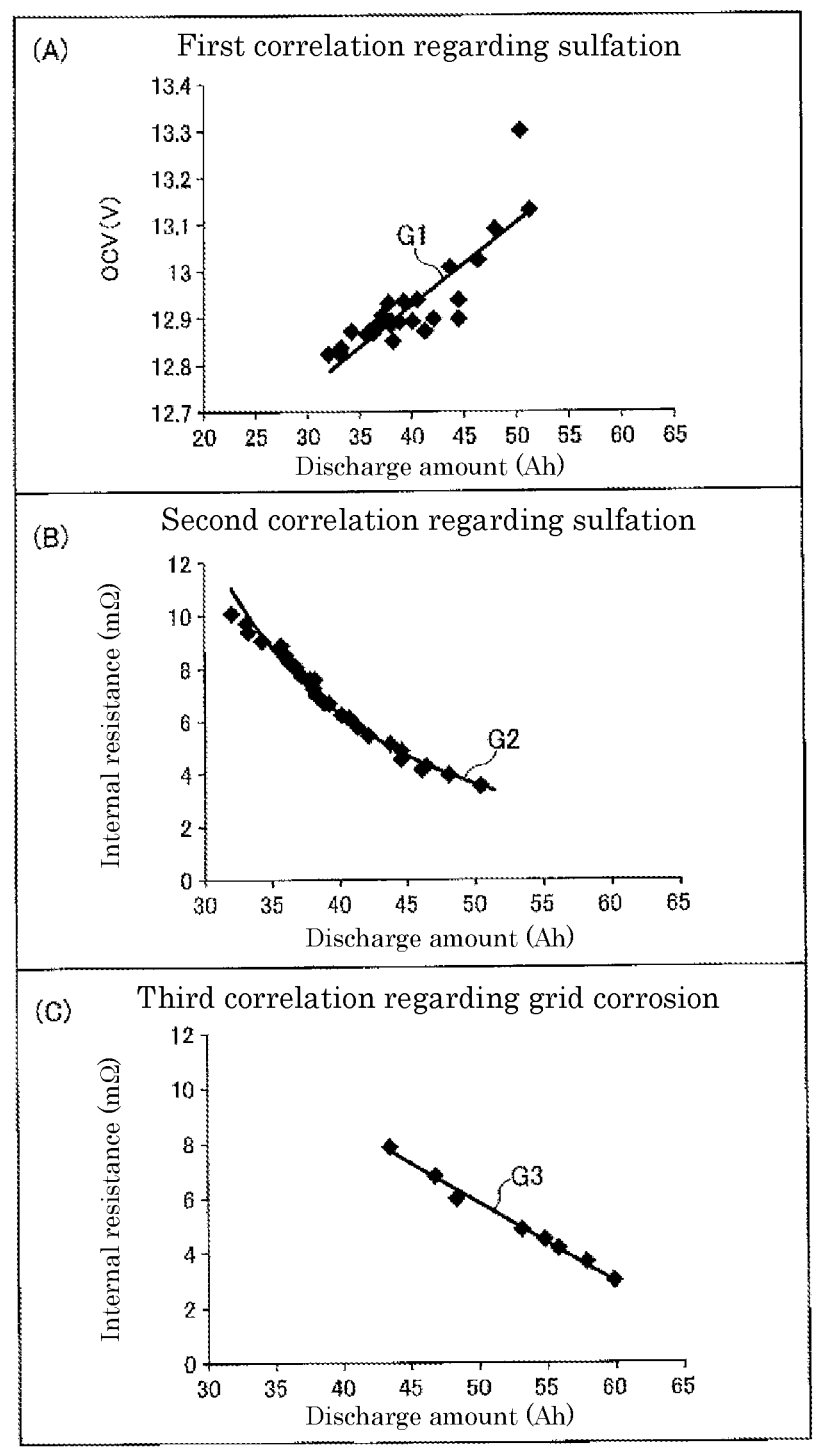
FIGS. 10(A) to 10(C) are explanatory diagrams illustrating respective correlations.

FIG. 9 is a flowchart illustrating the flow of the first estimation processing. FIGS. 10(A) to 10(C) are explanatory diagrams illustrating the respective correlations. FIG. 10(A) illustrates a first correlation between the open voltage and the amount of discharge of the lead-acid battery 100, associated with the progress of sulfation. Specifically, a plurality of dots plotted in the same figure (A) shows the measurement results of the open voltages and the amounts of discharge from the fully charged state of the lead-acid batteries 100, for a plurality of lead-acid batteries 100 in which the degree of progress in sulfation is different and the degree of progress in grid corrosion is substantially the same. Further, the same figure (A) illustrates an approximate line G1 of the plurality of measurement results. FIG. 10(B) illustrates a second correlation between the internal resistance and the amount of discharge of the lead-acid battery 100, associated with the progress of sulfation. Specifically, a plurality of dots plotted in the same figure (B) shows the measurement results of the internal resistance and the amounts of discharge from the fully charged state of the lead-acid batteries 100, for a plurality of lead-acid batteries 100 in which the degree of progress in sulfation is different and the degree of progress in grid corrosion is substantially the same. Further, the same figure (B) illustrates an approximate line G2 of the plurality of measurement results. FIG. 10(C) illustrates a third correlation between the internal resistance and the amount of discharge of the lead-acid battery 100, associated with the progress of grid corrosion. Specifically, a plurality of dots plotted in the same figure (C) shows the measurement results of the internal resistance and the amounts of discharge from the fully charged state of the lead-acid batteries 100, as to a plurality of lead-acid batteries 100 among which the degree of progress in grid corrosion is different and the degree of progress in sulfation is substantially the same. Further, the same figure (C) illustrates an approximate line G3 of the plurality of measurement results.

In order to obtain the measurement results illustrated in FIGS. 10(A) and 10(B), charge and discharge are performed under first test conditions for bringing the lead-acid battery 100 into a poor charged state, whereby for the lead-acid battery 100, the sulfation is mainly caused to progress. The first test conditions are as follows.

<First Test Conditions>

Under an environment temperature of 25° C., the following cycles 1 to 3 are repeated until the discharge end voltage of the lead-acid battery 100 reaches a predetermined value.

(Cycle 1): A first charge-discharge test is performed once. In the first charge-discharge test, after constant current discharge is performed with a discharge current of 12 A for four hours (discharge amount of 48 Ah), constant current charge with a charge current of 30 A or more and 60 A or less is started. Each time the voltage of the lead-acid battery 100 reaches a reference voltage (e.g., 14.4 V), the charge current value is sequentially switched to 12 A, 6 A, 3 A, and 1.5 A, and then the charge current value is maintained at 1.5 A. Thereafter, when one hour has passed since the start of charge in the first charge-discharge test, the first charge-discharge test is completed. When one time of the first charge-discharge test is completed, this cycle 1 ends, and the processing shifts to cycle 2.

(Cycle 2): A second charge-discharge test is repeated eight times. In the second charge-discharge test, after constant current discharge is performed with a discharge current of 12 A for three hours (discharge amount of 36 Ah), constant current charge with a charge current of 30 A or more and 60 A or less is started. Each time the voltage of the lead-acid battery 100 reaches the reference voltage, the charge current value is sequentially switched to 12 A, 6 A, 3 A, and 1.5 A, and then the charge current value is maintained at 1.5 A. Thereafter, when one hour has passed since the start of charge in the second charge-discharge test, the second charge-discharge test is completed. When eight times of the second charge-discharge test are completed, this cycle 2 ends, and the processing shifts to cycle 3.

(Cycle 3): A third charge-discharge test is performed once. In the third charge-discharge test, after constant current discharge is performed with a discharge current of 12 A for three hours (discharge amount of 36 Ah), constant current charge with a charge current of 12 A is started. Each time the voltage of the lead-acid battery 100 reaches the reference voltage, the charge current value is sequentially switched to 6 A, 3 A, and 1.5 A, and then the charge current value is maintained at 1.5 A. Thereafter, in the third charge-discharge test, the charge current value is switched to 1.5 A, and when 2.5 hours has passed since the voltage of the lead-acid battery 100 reached the reference voltage, the third charge-discharge test is completed. When one time of the third charge-discharge test is completed, this cycle 3 ends, and the processing returns to cycle 1.

In order to obtain the measurement results illustrated in FIG. 10(C), charge and discharge are performed under second test conditions for bringing the lead-acid battery 100 into an overcharged state, whereby for the lead-acid battery 100, the grid corrosion is mainly caused to progress. The second test condition is as follows.

<Second Test Condition>

Under an environment temperature of 25° C., cycle 4 below is repeated until the discharge end voltage of the lead-acid battery 100 reaches a predetermined value.

(Cycle 4): A fourth charge-discharge test is performed. In the fourth charge-discharge test, after constant current discharge is performed with a discharge current of 12 A for four hours (discharge amount of 48 Ah), constant current charge with a charge current of 12 A is started. Each time the voltage of the lead-acid battery 100 reaches the reference voltage, the charge current value is sequentially switched to 6 A, 3 A, and 1.5 A, and then the charge current value is maintained at 1.5 A. In the fourth charge-discharge test, when 2.5 hours has passed since the charge current value was switched to 1.5 A, one time of this cycle 4 is completed, and cycle 4 is repeated again.

(Defining of Sulfation Capacity Decrease Amount ΔCA)

As illustrated in FIG. 9, the first estimation processing unit 530 first defines sulfation capacity decrease amount ΔCA (S210 to S220). Specifically, the open voltage defining unit 531 defines the value of the open voltage (OCV) of the lead-acid battery 100 (S210). The first estimation processing is performed on condition that the above-described estimation timing has come (S110: YES). Therefore, at this point, a predetermined time has already passed since the stopping of the drive motor 300 in the golf cart 60 or the completion of the charge of the lead-acid battery 100. In the present embodiment, the predetermined time is assumed to be a time sufficient for measuring the open voltage, and at the time of performing the first estimation processing, based on the detection result from the voltage detection unit 450, the current voltage value of the lead-acid battery 100 is taken as the value of the open voltage. When a dark current flows through the lead-acid battery 100 at the stoppage of the drive motor 300 or at some other point, a value obtained by performing correction processing on the current voltage value of the lead-acid battery 100 according to the amount of dark current is preferably taken as the value of the open voltage. As the defining method for the open voltage, various known methods can be adopted.

Next, the sulfation capacity defining unit 532 defines the sulfation capacity decrease amount ΔCA (S220). Specifically, the sulfation capacity defining unit 532 defines the sulfation capacity decrease amount ΔCA by using the value of the open voltage defined by the open voltage defining unit 531 and information on the first correlation illustrated in FIG. 10(A). In the present embodiment, as the information on the first correlation, first map data (lookup table) is used which shows the correspondence between the value of the open voltage and the amount of discharge in a plurality of measurement results illustrated in FIG. 10(A). That is, the sulfation capacity defining unit 532 extracts the amount of discharge corresponding to the value of the open voltage defined by the open voltage defining unit 531 with reference to the first map data, and sets the difference between the amount of discharge corresponding to the initial value of the open voltage at the time when the battery is new and the amount of discharge extracted this time, as the sulfation capacity decrease amount ΔCA. Note that the initial value of the open voltage is preferably stored in the storage unit 420 in advance. Further, a function showing the approximate line G1 (e.g., linear function or quadratic function) may be used as the information on the first correlation. The sulfation capacity defining unit 532 corresponds to a first capacity defining unit in the claims, and the sulfation capacity decrease amount ΔCA corresponds to an amount of change in a first capacity in the claims.

(Defining of Grid-Corrosion Capacity Decrease Amount ΔCB)

The first estimation processing unit 530 defines the grid-corrosion capacity decrease amount ΔCB (S230 to S260). Specifically, the sulfation resistance defining unit 533 defines the amount of increase in the internal resistance of the lead-acid battery 100 from the time when the battery is new (hereinafter referred to as "sulfation resistance increase amount ΔRA") as the sulfation proceeds (S230). Specifically, the sulfation resistance defining unit 533 defines the sulfation resistance increase amount ΔRA by using the sulfation capacity decrease amount ΔCA defined by the sulfation capacity defining unit 532 and information on the second correlation illustrated in FIG. 10(B). In the present embodiment, as the information on the second correlation, second map data is used which shows the correspondence between the value of the internal resistance and the amount of discharge in a plurality of measurement results illustrated in FIG. 10(B). That is, the sulfation resistance defining unit 533 extracts the internal resistance corresponding to the amount of the discharge extracted by the sulfation capacity defining unit 532 with reference to the second map data, and sets the difference between the initial value of the internal resistance corresponding to the initial value of the amount of discharge at the time when the battery is new and the value of the internal resistance extracted this time, as the sulfation resistance increase amount ΔRA. Note that the initial value of the amount of discharge is preferably stored in the storage unit 420 in advance. Further, a function showing the approximate line G2 (e.g., linear function or quadratic function) may be used as the information on the second correlation. The sulfation resistance defining unit 533 corresponds to a first internal resistance defining unit in the claims, and the sulfation resistance increase amount ΔRA corresponds to an amount of change in first internal resistance in the claims.

Next, the overall resistance defining unit 534 defines an overall internal resistance increase amount ΔR of the lead-acid battery 100 (S240). Specifically, the overall resistance defining unit 534 calculates the value of the overall internal resistance of the lead-acid battery 100 by dividing the value of the voltage of the lead-acid battery 100 by the value of the current flowing through the lead-acid battery 100 based on the detection result from the voltage detection unit 450 and the detection result from the current detection unit 460. Then, the overall resistance defining unit 534 sets the difference between the initial value of the overall internal resistance at the time when the battery is new and the value of the overall internal resistance calculated this time, as the overall internal resistance increase amount ΔR. As the defining method for the overall internal resistance of the lead-acid battery 100, various known methods can be adopted. Note that the initial value of the overall internal resistance is preferably stored in the storage unit 420 in advance. The overall internal resistance increase amount ΔR corresponds to an amount of change in overall internal resistance in the claims.

Next, the grid-corrosion resistance defining unit 535 defines the amount of increase in the internal resistance of the lead-acid battery 100 from the time when the battery is new, associated with the progress of grid corrosion (hereinafter referred to as "grid-corrosion resistance increase amount ΔRB") (S250). Specifically, the grid-corrosion resistance defining unit 535 calculates the grid-corrosion resistance increase amount ΔRB (=ΔR−ΔRA) by subtracting the sulfation resistance increase amount ΔRA defined by the sulfation resistance defining unit 533 from the overall internal resistance increase amount ΔR defined by the overall resistance defining unit 534. The grid-corrosion resistance defining unit 535 corresponds to a second internal resistance defining unit in the claims, and the grid-corrosion resistance increase amount ΔRB corresponds to an amount of change in second internal resistance in the claims.

Next, the grid-corrosion capacity defining unit 536 defines the grid-corrosion capacity decrease amount ΔCB (S260). Specifically, the grid-corrosion capacity defining unit 536 defines the grid-corrosion capacity decrease amount ΔCB by using the grid-corrosion resistance increase amount ΔRB defined by the grid-corrosion resistance defining unit 535 and information on the third correlation illustrated in FIG. 10(C). In the present embodiment, as the information on the third correlation, third map data is used which shows the correspondence between the value of the internal resistance and the amount of discharge in a plurality of measurement results illustrated in FIG. 10(C). That is, the grid-corrosion capacity defining unit 536 extracts the amount of discharge corresponding to the value obtained by adding the grid-corrosion resistance increase amount ΔRB to the initial value of the internal resistance at the time when the battery is new with reference to the third map data, and sets the difference between the amount of discharge corresponding to the initial value of the internal resistance at the time when the battery is new and the amount of discharge extracted this time, as the grid-corrosion capacity decrease amount ΔCB. Note that the initial value of the internal resistance is preferably stored in the storage unit 420 in advance. Further, a function showing the approximate line G3 (e.g., linear function or quadratic function) may be used as the information on the third correlation. The grid-corrosion capacity defining unit 536 corresponds to a second capacity defining unit in the claims, and the grid-corrosion capacity decrease amount ΔCB corresponds to an amount of change in a second capacity in the claims.

(Defining of Battery Capacity)

Next, the first battery capacity defining unit 537 defines the present battery capacity of the lead-acid battery 100 based on the sulfation capacity decrease amount ΔCA defined by the sulfation capacity defining unit 532 and the grid-corrosion capacity decrease amount ΔCB defined by the grid-corrosion capacity defining unit 536. Specifically, the first battery capacity defining unit 537 defines the present battery capacity of the lead-acid battery 100 by subtracting the sulfation capacity decrease amount ΔCA and the grid-corrosion capacity decrease amount ΔCB from the initial value of the battery capacity (discharge amount) at the time when the battery is new. According to the first estimation processing, for a plurality (e.g., 10) of lead-acid batteries 100 in which the degree of progress of each deterioration factor is different, an error between the value of the battery capacity estimated by the first estimation processing and the actual measurement of the battery capacity can be kept within 10%.

A-4. Second Estimation Processing:

Next, the second estimation processing will be described. The second estimation processing is the processing of estimating the battery capacity of the lead-acid battery 100 based on the voltage change tendency of the lead-acid battery 100 when the value of the current flowing through the lead-acid battery 100 is a reference value. The reference value is, for example, a nominal current value of the lead-acid battery 100.

(Relationship Between Voltage Change Tendency and Battery Capacity of Lead-Acid Battery 100)

Figure 11:
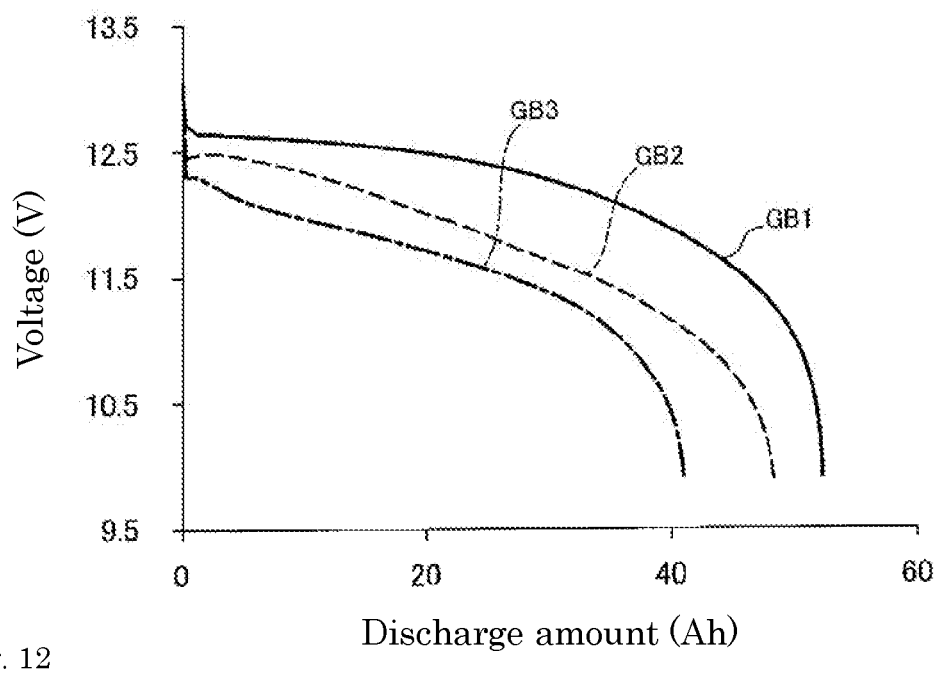
FIG. 11 is an explanatory diagram illustrating a relationship between a voltage change tendency and the amount of discharge of the lead-acid battery 100.

FIG. 11 is an explanatory diagram illustrating the relationship between the voltage change tendency and the amount of discharge of the lead-acid battery 100. FIG. 11 illustrates, for lead-acid batteries 100 each having a different amount of discharge (battery capacity) from the fully charged state, discharge curves (GB1 to GB3) showing changes in voltage when the batteries are discharged in a constant current state in which the value of the current flowing through the lead-acid batteries 100 is the reference value. The discharge curve GB1 is a discharge curve of the lead-acid battery 100 having the largest battery capacity, and the discharge curve GB3 is a discharge curve of the lead-acid battery 100 having the smallest battery capacity. As can be seen from FIG. 11, there is a correlation between the voltage change tendency (the slope of the discharge curve) of the lead-acid battery 100 and the battery capacity. Therefore, the battery capacity of the lead-acid battery 100 can be estimated by using the fourth correlation between the voltage change tendency and the battery capacity.

Figure 12:
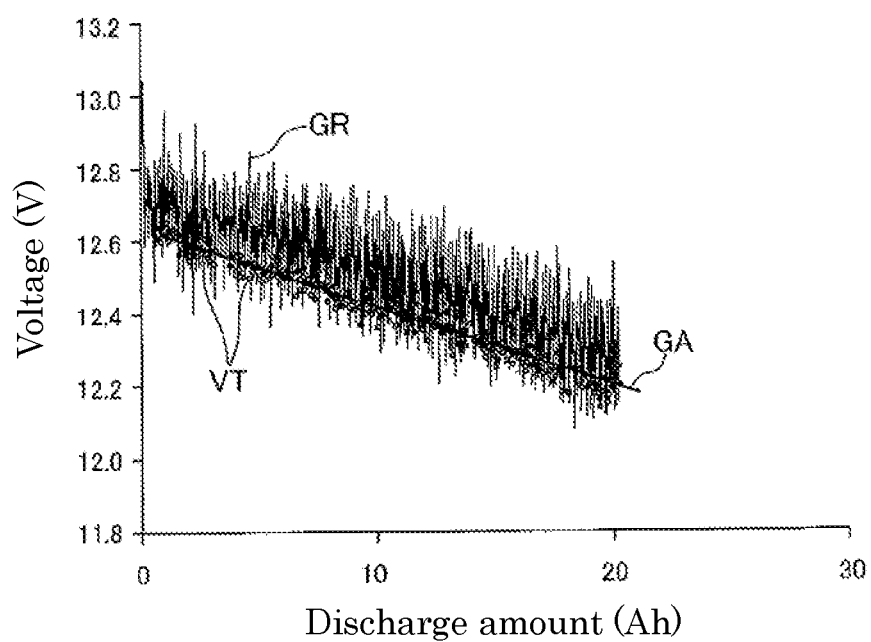
FIG. 12 is an explanatory diagram illustrating a voltage change of the lead-acid battery 100 during discharge to a load.

On the other hand, FIG. 12 is an explanatory diagram illustrating the voltage change of the lead-acid battery 100 during discharge to a load (drive motor 300). As illustrated in FIG. 12, it can be seen that during the discharge to the load (during the use of the lead-acid battery 100), the current flowing through the lead-acid battery 100 changes depending on the operation state of the load and the like, and accordingly, a waveform GR of the voltage of the lead-acid battery 100 is changing drastically. Therefore, the actual voltage change during the use of the lead-acid battery 100 cannot be directly compared with the slope of each discharge curve at the time of the constant current (hereinafter referred to as "reference slope"). Therefore, as described below, a plurality of voltage values VT when the current value of the lead-acid battery 100 is the reference value are defined from the actual voltage change during the use of the lead-acid battery 100, and the change tendency of the defined plurality of voltage values VT on an approximate straight line GA is taken as the actual change tendency of the voltage of the lead-acid battery 100 (hereinafter referred to as "actually measured slope").

(Contents of Second Estimation Processing)

Figure 13:
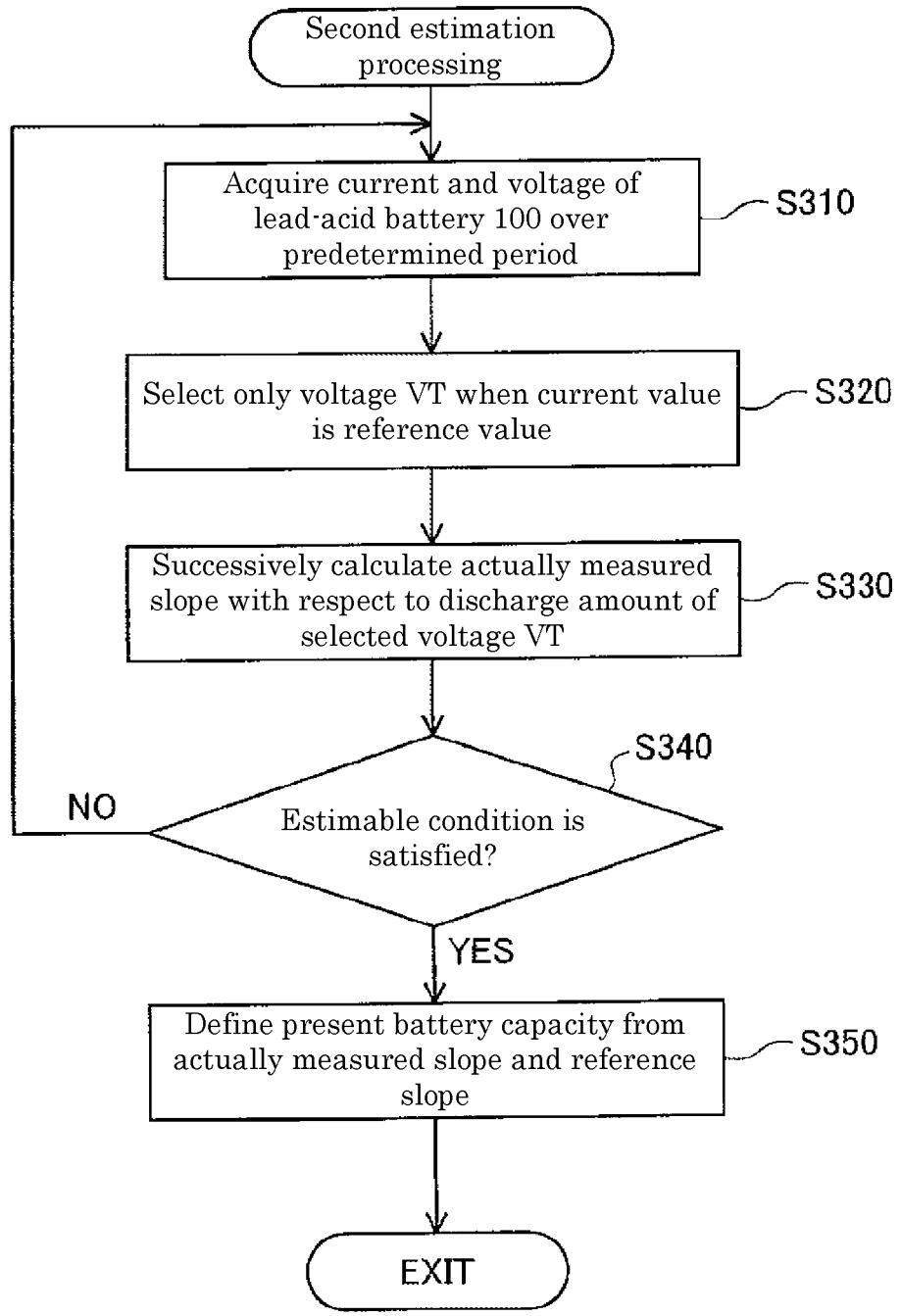
FIG. 13 is a flowchart illustrating a flow of second estimation processing.

FIG. 13 is a flowchart illustrating the flow of the second estimation processing. As illustrated in FIG. 13, the current-voltage acquisition unit 541 acquires the current value and the voltage value of the lead-acid battery 100 based on the detection result from the voltage detection unit 450 and the detection result from the current detection unit 460 over a predetermined period (S310). As a result, the current-voltage acquisition unit 541 acquires a plurality of voltage values that change drastically as illustrated in FIG. 12 and current values corresponding to the plurality of voltage values. The current-voltage acquisition unit 541 corresponds to an acquisition unit in the claims.

Next, the voltage defining unit 542 selects a plurality of voltage values VT when the current value is the reference value from the plurality of voltage values acquired by the current-voltage acquisition unit 541 (S320). Subsequently, the second battery capacity defining unit 543 defines the actually measured slope at the plurality of voltage values VT selected by the voltage defining unit 542 (S330).

Next, the second battery capacity defining unit 543 determines whether an estimable condition is satisfied (S340). The estimable condition is a condition for the accuracy in the estimation of the battery capacity by the second estimation processing to be equal to or higher than a predetermined level. The estimable condition includes that the lead-acid battery 100 has reached a predetermined depth of discharge. In order to make the accuracy in the estimation of the battery capacity by the second estimation processing equal to or higher than the predetermined level, it is necessary to set the definition accuracy for the actually measured slope to be equal to or higher than a predetermined level. In order to make the definition accuracy for the actually measured slope equal to or higher than the predetermined level, it is necessary to acquire the voltage value VT selected by the voltage defining unit 542 during a period when the discharge is performed with the depth of discharge going to a deep level. That is, when the lead-acid battery 100 is repeatedly charged and discharged with the depth of discharge in a shallow state, the second estimation processing cannot be used because the definition accuracy for the actually measured slope is low. Note that when it is recognized that the charge of the lead-acid battery 100 by the charger has been started without defining the depth of discharge of the lead-acid battery 100, the lead-acid battery 100 may be considered to have reached the predetermined depth of discharge. This is effective when the charge is performed by the charger so long as the lead-acid battery 100 has come into a state where the depth of discharge is deep.

When it is determined that the estimable condition is not satisfied (S340: NO), the second estimation processing unit 540 returns to S310. When it is determined that the estimable condition is satisfied (S340: YES), the amount of discharge corresponding to the reference slope closest to the actually measured slope is extracted with reference to a map table showing a correlation between the battery capacity and the reference slope, and the amount of discharge extracted this time is defined as the present battery capacity of the lead-acid battery 100. Note that the difference between the initial value of the amount of discharge and the amount of discharge extracted this time can be defined as the amount of change in the battery capacity of the lead-acid battery 100 from the new product.

A-5. Proper Use of First Estimation Processing and Second Estimation Processing:

As described above, according to the first estimation processing, it is possible to accurately estimate the battery capacity of the lead-acid battery 100 by individually defining the amount of decrease in the battery capacity of the lead-acid battery 100 associated with the progress of the deterioration factor. However, as described above, the first estimation processing uses the correlation between the open voltage and the battery capacity, associated with the progress of sulfation, and the like. Here, for example, when the temperature of the lead-acid battery 100 is equal to or higher than a predetermined temperature, or when the amount of overcharge of the lead-acid battery 100 is equal to or higher than a reference amount, the concentration of the electrolyte solution 18 fluctuates, so that the correlation between the open voltage and the battery capacity, associated with the progress of sulfation may fluctuate, and the battery capacity of the lead-acid battery 100 may not be able to be accurately estimated.

Therefore, as described above, in the battery management processing, when it is determined that the switching condition is not satisfied (S120: NO), the first estimation processing is performed (S130), and when it is determined that the switching condition is satisfied (S120: YES), the second estimation processing is performed (S140). In the second estimation processing, since the correlation between the open voltage and the battery capacity, associated with the progress of sulfation, is not used, it is possible to prevent a decrease in the estimation accuracy for the battery capacity of the lead-acid battery 100 caused by the fluctuation of the correlation. However, as described above, when the lead-acid battery 100 is repeatedly charged and discharged with the depth of discharge in a shallow state, the second estimation processing cannot be used. For this reason, in the present embodiment having been applied to the golf cart 60 in which the lead-acid battery 100 is repeatedly charged and discharged with the depth of discharge in a shallow state, the first estimation processing is performed with priority.

B. Modifications

The technique disclosed in the present specification is not limited to the embodiment described above but can be modified into various forms without departing from the gist thereof, and for example, the following modifications are possible.

In the above embodiment, the golf cart 60 has been exemplified as the energy storage system, but the present invention is not limited to this, and there may be used, for example, a moving body such as a go-kart running in an amusement park or a truck running in a factory, or a device disposed and fixed at a predetermined location. In short, the energy storage system only needs to be provided with a secondary battery.

In the above embodiment, the lead-acid battery 100 has been exemplified as the secondary battery, but the present invention is not limited to this, and a lithium ion battery or the like may be used. Further, the deterioration factor is not limited to sulfation or grid corrosion and may be another deterioration factor. In short, in a secondary battery, with the use of one in which the amount of change in the battery capacity associated with the progress of the deterioration factor correlates with the open voltage and one in which the amount of change in the battery capacity associated with the progress of the deterioration factor does not correlate with the open voltage, by individually defining the amounts of change in capacity caused by these deterioration factors, the battery capacity of the secondary battery can be estimated accurately.

In the above embodiment, the BMU 400 disposed outside the lead-acid battery 100 has been exemplified as the battery management unit and the capacity estimation device, but the present invention is not limited to this. For example, a control unit provided in a secondary battery may be used, or the unit may be provided in a server or the like outside a moving body and may remotely manage the state (deterioration state, etc.) of a secondary battery (lead-acid battery) provided in the moving body.

In the above embodiment, the overall battery capacity of the lead-acid battery 100 has been estimated, but the present invention is not limited to this, and the battery capacity may be individually estimated for the cells C provided in the lead-acid battery 100. Further, instead of the battery capacity of the lead-acid battery 100, the amount of change in battery capacity from the time when the battery is new (the sum of the sulfation capacity decrease amount $\Delta CA$ and the grid-corrosion capacity decrease amount $\Delta CB$) may be defined. Moreover, both the battery capacity of the lead-acid battery 100 and the amount of change in battery capacity from the time when the battery is new may be defined.

In the above embodiment, the overall resistance defining unit 534 has calculated the internal resistance value by obtaining the voltage and current of the lead-acid battery 100 from the outside, but the overall resistance defining unit 534 may acquire the internal resistance value of the lead-acid battery 100 from the outside. In the above embodiment, the first battery capacity defining unit 537 has simply subtracted the sulfation capacity decrease amount $\Delta CA$ and the grid-corrosion capacity decrease amount $\Delta CB$ from the initial value of the battery capacity. However, in consideration of the characteristics and the surrounding environment of the lead-acid battery 100, at least one of the sulfation capacity decrease amount $\Delta CA$ or the grid-corrosion capacity decrease amount $\Delta CB$ may be multiplied by a weighting factor, which may then be subtracted from the initial value of the battery capacity.

In the above embodiment, the reference state has been a state at the time when the lead-acid battery 100 is new, but the present invention is not limited to this. The reference state may be a state at the time when a predetermined time has passed since the start of use of the lead-acid batteries 100, or a state at the time when the number of times of charge from the start of use of lead-acid batteries 100 has reached a predetermined number of times.

Further, in the above embodiment, the display unit 64 has been exemplified as the notification unit, but the present invention is not limited to this. The notification unit may be a sound generation unit such as a speaker or a communication unit that outputs a communication signal to an external device.

In the above embodiment, the first estimation processing may be always performed, and the second estimation processing may not be performed. Further, instead of the second estimation processing, conventional estimation processing may be performed where the battery capacity is estimated based on the value of the internal resistance of the secondary battery. Moreover, even when only the second estimation processing is performed independently, the estimation accuracy for the battery capacity of the secondary battery can be improved as compared to the conventional estimation processing.

DESCRIPTION OF REFERENCE SIGNS

- 10: housing
- 12: container
- 14: lid
- 16: cell chamber
- 18: electrolyte solution
- 20: element
- 30: positive-side terminal
- 32: positive-side bushing
- 34: positive pole
- 40: negative-side terminal
- 42: negative-side bushing
- 44: negative pole
- 52: positive-side strap
- 54: negative-side strap
- 56: connecting member
- 58: partition
- 60: golf cart
- 62: operation unit
- 64: display unit
- 66: display pattern
- 100: lead-acid battery
- 210: positive electrode plate
- 212: positive current collector
- 214: positive electrode lug
- 216: positive active material
- 220: negative electrode plate
- 222: negative current collector
- 224: negative electrode lug
- 226: negative active material
- 230: separator
- 300: drive motor
- 400: BMU
- 410: control unit
- 420: storage unit
- 421: battery management program
- 422: map data 430: input unit
440: interface unit
450: voltage detection unit
460: current detection unit
470: temperature detection unit
510: condition determination unit
520: display control unit
530: estimation processing unit
531: open voltage defining unit
532: sulfation capacity defining unit
533: sulfation resistance defining unit
534: overall resistance defining unit
535: grid-corrosion resistance defining unit
536: grid-corrosion capacity defining unit
537: battery capacity defining unit
540: estimation processing unit
541: current-voltage acquisition unit
542: voltage defining unit
543: battery capacity defining unit
C: cell
CA: sulfation capacity decrease amount Δ
CB: grid-corrosion capacity decrease amount Δ
G1 to G3: approximate line
GA: approximate straight line
GB1 to GB3: discharge curve
GR: waveform
ΔR: overall internal resistance increase amount
ΔRA: sulfation resistance increase amount
ΔRB: grid-corrosion resistance increase amount
VT: voltage value

The invention claimed is:

1. An energy storage system comprising:
a lead-acid battery;
an electric motor operated by electric power from the lead-acid battery;
a notification unit; and
a battery management unit,
wherein
the battery management unit
defines, based on an open voltage of the lead-acid battery, a first amount of change in a capacity of the lead-acid battery from a reference state, correlating with the open voltage of the lead-acid battery and caused by a first deterioration factor,
defines, based on the first amount of change in the capacity and an amount of change in overall internal resistance of the lead-acid battery from the reference state, a second amount of change in the capacity of the lead-acid battery, not correlating with the open voltage and caused by a second deterioration factor, and
defines, based on the first amount of change in the capacity and the second amount of change in the capacity, at least one of a battery capacity of the lead-acid battery or an amount of change in the battery capacity from the reference state, and
the notification unit performs a notification operation according to at least one of the battery capacity defined by the battery management unit or the amount of change in the battery capacity from the reference state.

2. The energy storage system according to claim 1, wherein
the first deterioration factor is sulfation at a negative electrode provided in the lead-acid battery, and
the second deterioration factor is corrosion of a grid provided in the lead-acid battery.

3. A capacity estimation device for a secondary battery, comprising:
an open voltage defining unit that defines a value of an open voltage of the secondary battery;
a first capacity defining unit that defines, based on the defined value of the open voltage and a first correlation between a first capacity correlating with the open voltage and caused by a first deterioration factor of the secondary battery and the open voltage, an amount of change in the first capacity of the secondary battery from a reference state;
a first internal resistance defining unit that defines, based on the defined amount of change in the first capacity and a second correlation between the first capacity and first internal resistance of the secondary battery, an amount of change in the first internal resistance caused by the first deterioration factor;
an overall resistance defining unit that defines an amount of change in overall internal resistance of the secondary battery;
a second internal resistance defining unit that defines an amount of change in second internal resistance by subtracting the defined amount of change in the first internal resistance from the defined amount of change in the overall internal resistance;
a second capacity defining unit that defines, based on the defined amount of change in the second internal resistance and a third correlation between a second capacity not correlating with the open voltage and caused by a second deterioration factor of the secondary battery and the second internal resistance, an amount of change in the second capacity of the secondary battery from the reference state; and
a first battery capacity defining unit that defines a battery capacity of the secondary battery based on the defined amount of change in the first capacity and the defined amount of change in the second capacity.

4. The capacity estimation device for a secondary battery according to claim 3, further comprising:
a condition determination unit that determines whether a switching condition including at least one of a temperature of the secondary battery being equal to or higher than a predetermined temperature or an amount of overcharge of the secondary battery being equal to or higher than a reference amount is satisfied; and
a second battery capacity defining unit that defines the battery capacity of the secondary battery by another estimation method not using the open voltage when it is determined that the switching condition is satisfied.

5. The capacity estimation device for a secondary battery according to claim 4, further comprising:
an acquisition unit that acquires current and voltage of the secondary battery; and
a voltage defining unit that defines, based on the current and the voltage acquired by the acquisition unit, a value of the voltage of the secondary battery a plurality of times when a value of the current of the secondary battery is a reference value,
wherein the second battery capacity defining unit defines, based on a fourth correlation between a change tendency of the voltage the secondary battery and the battery capacity of the secondary battery, a value of the battery capacity of the secondary battery corresponding to a change tendency in the value of the voltage defined the plurality of times.

6. A capacity estimation method for a lead-acid battery, comprising the steps of:

defining, based on an open voltage of the lead-acid battery, a first amount of change in a capacity of the lead-acid battery from a reference state, correlating with the open voltage and caused by a first deterioration factor;

defining, based on the first amount of change in the capacity and an amount of change in overall internal resistance of the lead-acid battery from the reference state, a second amount of change in the capacity of the lead-acid battery, not correlating with the open voltage and caused by a second deterioration factor, and defining a battery capacity of the lead-acid battery based on the first amount of change in the capacity and the second amount of change in the capacity.

* * * * *